(12) United States Patent
Nimura et al.

(10) Patent No.: US 12,092,846 B2
(45) Date of Patent: Sep. 17, 2024

(54) FILTER AND IMAGING APPARATUS

(71) Applicant: FUJIFILM Corporation, Tokyo (JP)

(72) Inventors: Shigeaki Nimura, Kanagawa (JP);
Shuji Ono, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 328 days.

(21) Appl. No.: 17/572,556

(22) Filed: Jan. 10, 2022

(65) Prior Publication Data
US 2022/0128747 A1 Apr. 28, 2022

Related U.S. Application Data

(63) Continuation of application No. PCT/JP2020/024551, filed on Jun. 23, 2020.

(30) Foreign Application Priority Data

Jul. 17, 2019 (JP) .................. 2019-131728

(51) Int. Cl.
*G02B 5/26* (2006.01)
*G02B 5/30* (2006.01)
*H01L 27/146* (2006.01)

(52) U.S. Cl.
CPC ............. *G02B 5/26* (2013.01); *G02B 5/3083* (2013.01); *H01L 27/14625* (2013.01)

(58) Field of Classification Search
None
See application file for complete search history.

(56) References Cited

U.S. PATENT DOCUMENTS

| 6,788,369 B2 | 9/2004 | Ichihashi |
| 8,541,935 B2 | 9/2013 | Takeuchi et al. |
| 8,854,525 B2 | 10/2014 | Imamura |

(Continued)

FOREIGN PATENT DOCUMENTS

| JP | 2000258760 | 9/2000 |
| JP | 2002350642 | 12/2002 |

(Continued)

OTHER PUBLICATIONS

Shuji Ono, "Xin1 camera a new technique to take one shot of multispectral image with a polarization sensor," SSII2019 The 25th Symposium on Sensing via Image Information, Jun. 2019, pp. 1-19.

(Continued)

*Primary Examiner* — Richard H Kim
(74) *Attorney, Agent, or Firm* — JCIPRNET

(57) ABSTRACT

Provided a filter and an imaging apparatus for obtaining a higher-quality multispectral image in which the tint of the image is uniform. The filter includes: an optical filter layer; and a patterned retardation layer that is laminated on the optical filter layer. The optical filter layer includes at least three reflective layers that are formed of a cholesteric liquid crystal layer, and the reflective layers have different reflection center wavelengths. Alternatively, the optical filter layer includes a reflective layer that is formed of a cholesteric liquid crystal layer having at least two different reflection center wavelengths. The patterned retardation layer has a slow axis in a direction corresponding to the reflection center wavelength of the reflective layer.

9 Claims, 15 Drawing Sheets

(56) References Cited

U.S. PATENT DOCUMENTS

| 9,507,123 | B2 | 11/2016 | Yamagata et al. |
| 9,671,540 | B2 | 6/2017 | Ichihashi |
| 11,122,242 | B2 | 9/2021 | Ono |
| 2015/0130962 | A1 | 5/2015 | Hiramoto et al. |
| 2016/0223730 | A1* | 8/2016 | Kim ................. G02F 1/133536 |
| 2019/0306386 | A1 | 10/2019 | Akkaya et al. |

FOREIGN PATENT DOCUMENTS

| JP | 2004145327 | 5/2004 |
| JP | 2010245870 | 10/2010 |
| JP | 2011081334 | 4/2011 |
| JP | 2015004856 | 1/2015 |
| JP | 2018036314 | 3/2018 |
| WO | 2012143983 | 10/2012 |
| WO | 2014020791 | 2/2014 |
| WO | 2015004886 | 1/2015 |
| WO | 2020075523 | 4/2020 |

OTHER PUBLICATIONS

Ethan Schonbrun et al., "Polarization encoded color camera," Optics Letters, vol. 39, Mar. 2014, pp. 1433-1436.
"International Search Report (Form PCT/ISA/210) of PCT/JP2020/024551," mailed on Aug. 25, 2020, with English translation thereof, pp. 1-6.
"Written Opinion of the International Searching Authority (Form PCT/ISA/237)" of PCT/JP2020/024551, mailed on Aug. 25, 2020, with English translation thereof, pp. 1-8.
"Office Action of Japan Counterpart Application", issued on Jan. 24, 2023, with English translation thereof, p. 1-p. 7.

* cited by examiner

FILTER AND IMAGING APPARATUS

CROSS-REFERENCE TO RELATED APPLICATIONS

This application is a Continuation of PCT International Application No. PCT/JP2020/024551 filed on Jun. 23, 2020, which claims priority under 35 U.S.C. § 119(a) to Japanese Patent Application No. 2019-131728 filed on Jul. 17, 2019. The above application is hereby expressly incorporated by reference, in its entirety, into the present application.

BACKGROUND OF THE INVENTION

1. Field of the Invention

The present invention relates to a filter for acquiring images in a plurality of wavelength ranges and an imaging apparatus that acquires images in a plurality of wavelength ranges. In particular, the present invention relates to a filter and an imaging apparatus including the filter, the filter including: a reflective layer that has at least two different reflection wavelengths; and a retardation layer that has a slow axis in a direction corresponding to a reflection center wavelength of the reflective layer.

2. Description of the Related Art

As an imaging apparatus that acquires images in a plurality of wavelength ranges, that is, a so-called multispectral image, WO2012/143983A describes an imaging apparatus having a configuration in which a pupil portion of an optical system is divided, optical filters having different spectroscopic transmittances are disposed in the divided pupil portions, respectively, and a microlens array is disposed in front of an image sensor. The imaging apparatus acquires a multispectral image with one image sensor by guiding light from different optical regions of the pupil portion to different pixels using the beam separation effect by the microlens array.

However, the beam separation by the microlens array does not need to be completed. Therefore, the imaging apparatus of WO2012/143983A has a problem in that light leaks to adjacent pixels and interference (crosstalk) occurs.

In order to solve this problem, WO2015/004886A proposes that the influence of interference is removed by performing predetermined signal processing on a signal (pixel signal) obtained from each of the pixels.

SUMMARY OF THE INVENTION

However, the amount of interference occurring in each of the pixels in a case where a beam is separated using the microlens array varies depending on the positions of the pixels. Accordingly, in the imaging apparatus of WO2015/004886A, in order to obtain a higher-quality image in which the tint of the image is uniform, the amount of interference occurring in each pixel needs to be obtained. However, in order to obtain the amount of interference occurring in each pixel, a huge amount of effort is required.

The present invention has been made under these circumstances, and an object thereof is to provide a filter and an imaging apparatus for obtaining a higher-quality multispectral image in which the tint of the image is uniform.

In order to achieve the above-described object, according to the present invention, there is provided a filter comprising: an optical filter layer; and a patterned retardation layer that is laminated on the optical filter layer, in which the optical filter layer includes at least three reflective layers that are formed of a cholesteric liquid crystal layer, the reflective layers have different reflection center wavelengths, and the patterned retardation layer has a slow axis in a direction corresponding to the reflection center wavelength of the reflective layer.

In addition, according to the present invention, there is provided a filter comprising: an optical filter layer; and a patterned retardation layer that is laminated on the optical filter layer, in which the optical filter layer includes a reflective layer that is formed of a cholesteric liquid crystal layer having at least two different reflection center wavelengths, and the patterned retardation layer has a slow axis in a direction corresponding to the reflection center wavelength of the reflective layer.

It is preferable that a helical pitch of the cholesteric liquid crystal layer continuously changes such that the reflection center wavelength continuously changes.

It is preferable that the optical filter layer includes at least one compartment, and the reflective layer is provided in the compartment.

It is preferable that the optical filter layer includes at least three compartments, the reflective layer is provided in each of the compartments, and the reflection center wavelengths of the reflective layers of the compartments are different from each other.

It is preferable that the optical filter layer includes at least three compartments, and a plurality of reflective layers in which the reflection center wavelengths are different are provided in each of the compartments.

It is preferable that the compartment of the optical filter layer has a triangular shape, and the compartments having the triangular shape are disposed such that apexes thereof meet each other.

It is preferable that the compartment of the optical filter layer has a circular shape.

It is preferable that the compartment of the optical filter layer has a circular shape, and a plurality of reflective layers in which the reflection center wavelengths are different are provided in a radial shape starting from a center of the compartment having the circular shape.

In addition, according to the present invention, there is provided an imaging apparatus comprising: the filter; an imaging element that focuses light passing through the filter; and a polarization image sensor to which the light focused by the imaging element is input.

According to the present invention, a higher-quality multispectral image in which the tint of the image is uniform can be obtained.

DESCRIPTION OF THE PREFERRED EMBODIMENTS

Hereinafter, a filter and an imaging apparatus according to the present invention will be described in detail based on a preferred embodiment shown in the accompanying drawings.

The drawings described below are exemplary drawings for describing the present invention, and the present invention is not limited to the drawings described below.

In the following description, a numerical range indicated by the expression "to" includes numerical values described on both sides. For example, in a case where ε is a numerical value α1 to a numerical value β1, the range s is a range including the numerical value α1 and the numerical value β1, which is expressed by a mathematical symbol $\alpha1 \leq \varepsilon \leq \beta1$.

Unless specified otherwise, the meaning of an angle such as "an angle represented by a specific numerical value", "vertical", or "perpendicular" includes a case where an error range is generally allowable in the technical field.

In this present invention, "(meth)acrylate" represents "either or both of acrylate and methacrylate".

In the present invention, visible light refers to light having a wavelength which can be observed by human eyes among electromagnetic waves and refers to light in a wavelength range of 400 to 700 nm. Invisible light refers to light in a wavelength range of shorter than 400 nm or longer than 700 nm.

In addition, although not limited thereto, in visible light, light in a wavelength range of 420 to 490 nm refers to blue light (B), light in a wavelength range of 495 to 570 nm refers to green light (G), and light in a wavelength range of 620 to 700 nm refers to red light (R).

Further, in the present invention, an ultraviolet ray (ultraviolet light) refers to light in a wavelength range of 200 nm or longer and shorter than 380 nm, and an infrared ray (infrared light) refers to light in a wavelength range of longer than 780 nm and 1 mm or shorter. In particular, a near infrared range refers to light in a wavelength range of longer than 780 nm and 2000 nm or shorter.

[Imaging Apparatus]

Figure 1:
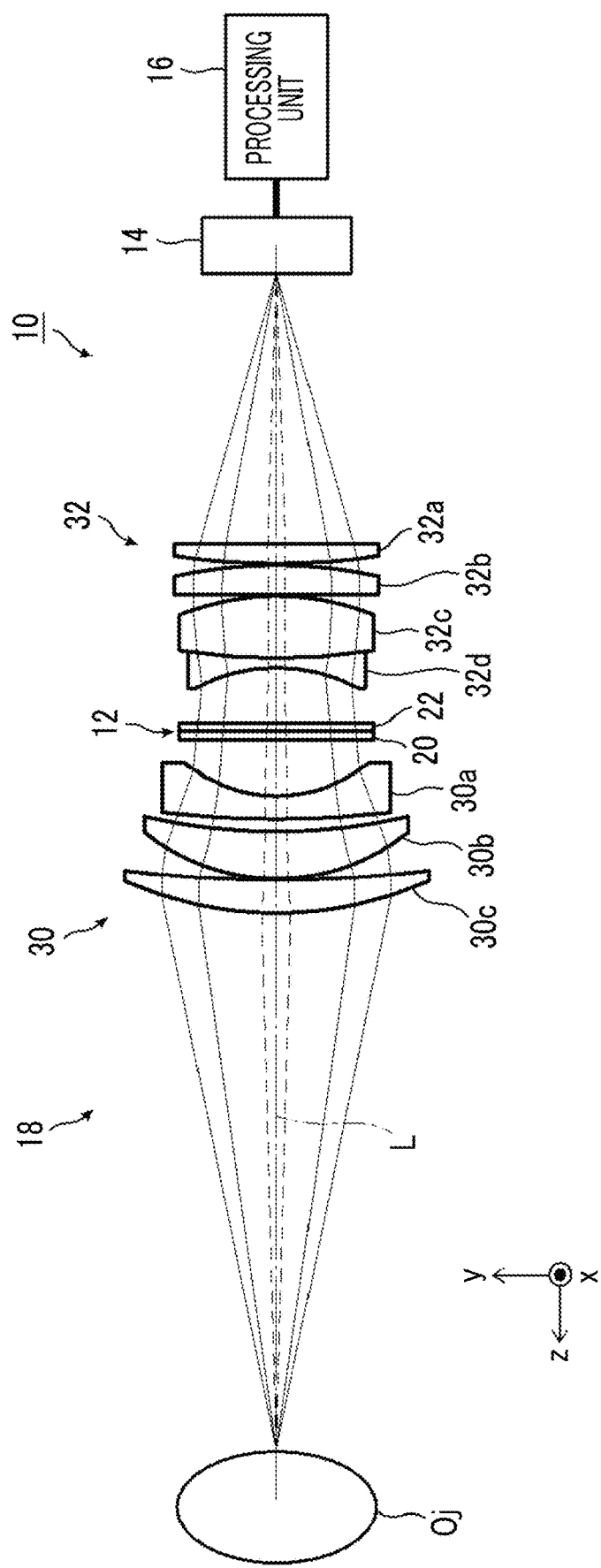
FIG. 1 is a schematic diagram showing an example of an imaging apparatus including a filter according to an embodiment of the present invention.

FIG. 1 is a schematic diagram showing an example of an imaging apparatus including a filter according to an embodiment of the present invention.

An imaging apparatus 10 shown in FIG. 1 includes a filter 12, a polarization image sensor 14, a processing unit 16, and an optical system 18. In the optical system 18, light carrying information of a subject Oj is focused through the filter 12, and the focused light is input the polarization image sensor 14. A signal based on the focused light is obtained by the polarization image sensor 14, and image data of the subject Oj is obtained by the processing unit 16. The image data of the subject Oj is image data representing a multispectral image of the subject Oj.

In addition, the imaging apparatus 10 can convert color information of the subject Oj into polarization information to obtain the polarization information of the subject Oj.

The filter 12 includes an optical filter layer 20 and a patterned retardation layer 22 that is laminated on the optical filter layer 20. The filter 12 is disposed at, for example, a pupil position of the optical system 18. In this case, the optical filter layer 20 is disposed on the subject Oj side, and the patterned retardation layer 22 is disposed on the polarization image sensor 14 side.

The optical filter layer 20 and the patterned retardation layer 22 will be described below in detail.

<Optical System>

The optical system 18 includes, for example, a first lens group 30 and a second lens group 32, in which the first lens group 30 and the second lens group 32 are disposed along an optical axis L. The first lens group 30 is disposed on the subject Oj side, the second lens group 32 is disposed on the polarization image sensor 14 side, and the filter 12 is disposed between the first lens group 30 and the second lens group 32. In the imaging apparatus 10, x, y, and z directions perpendicular to each other are set, and the optical axis L is an axis extending in a direction parallel to the z direction.

The first lens group 30 includes, for example, three lenses 30a, 30b, and 30c, and the three lenses 30a, 30b, and 30c are disposed along the optical axis L from the polarization image sensor 14 side. The three lenses 30a, 30b, and 30c are disposed such that convex surfaces thereof face the subject Oj side. For example, the lens 30a is a plano-concave lens, the lens 30b is a convex meniscus lens, and the lens 30c is a plano-convex lens. The first lens group 30 functions as an optical element that collects light carrying the information of the subject Oj in the filter 12. The first lens group 30 will also be referred to as a front lens element.

The second lens group 32 includes, for example, four lenses 32a, 32b, 32c, and 32d, and the four lenses 32a, 32b, 32c, and 32d are disposed along the optical axis L from the polarization image sensor 14 side. Among the four lenses 32a, 32b, 32c, and 32d, the three lenses 32b, 32c, and 32d are disposed such that convex surfaces thereof face the polarization image sensor 14 side. The lens 32a is disposed such that the convex surface thereof faces the subject Oj side. For example, the lens 32a is a plano-convex lens, the lens 32b is a plano-convex lens, the lens 32c is a biconvex lens, and the lens 32d is a plano-concave lens. The second lens group 32 functions as an imaging element that focuses light passing through the filter 12. The second lens group 32 will also be referred to as a rear lens element.

[First Example of Filter]

Figure 2:
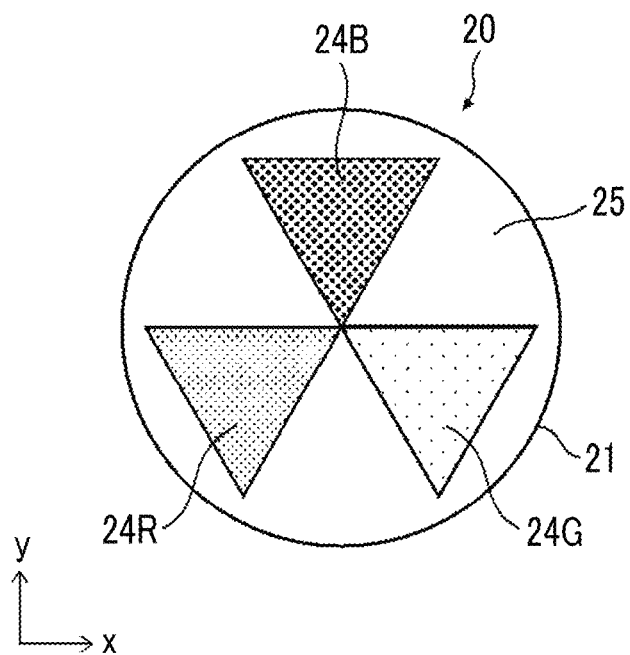
FIG. 2 is a schematic diagram showing a first example of an optical filter layer in the filter according to the embodiment of the present invention.
Figure 3:
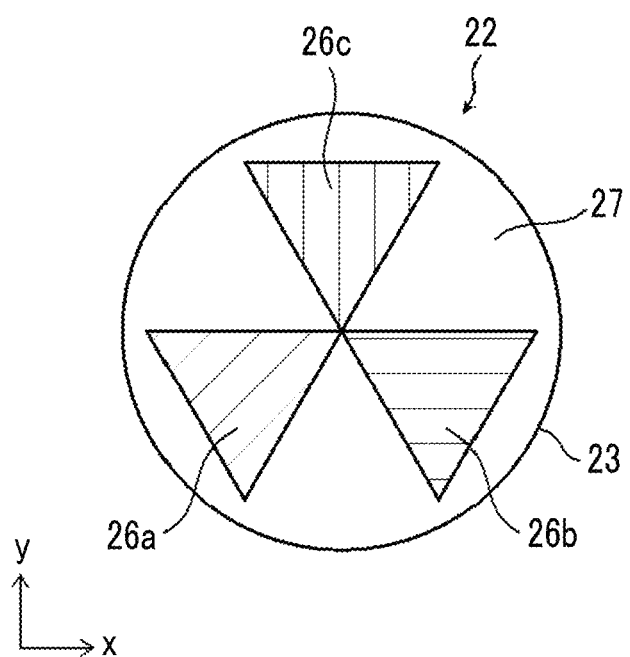
FIG. 3 is a schematic diagram showing a first example of a patterned retardation layer in the filter according to the embodiment of the present invention.

FIG. 2 is a schematic diagram showing a first example of the optical filter layer in the filter according to the embodiment of the present invention, and FIG. 3 is a schematic diagram showing a first example of the patterned retardation layer in the filter according to the embodiment of the present invention.

The optical filter layer 20 includes, on a support substrate 21, at least three reflective layers that are formed of a cholesteric liquid crystal layer, and the reflective layers have different reflection center wavelengths. The reflective layer reflects light having the reflection center wavelength, and the transmittance of the light having the reflection center wavelength is low.

In the optical filter layer 20 shown in FIG. 2, for example, three reflective layers 24R, 24G, and 24B are provided, and the reflection center wavelengths of the three reflective layers 24R, 24G, and 24B are different from each other. For example, the reflective layer 24R selectively reflects red light, the reflective layer 24G selectively reflects green light, and the reflective layer 24B selectively reflects blue light. In the three reflective layers 24R, 24G, and 24B, the reflection center wavelengths being different from each other represent that a difference between the peak wavelengths of the reflection center wavelengths is more than 100 nm.

All of the three reflective layers 24R, 24G, and 24B have the same size and shape. The three reflective layers 24R, 24G, and 24B have a triangular shape and are disposed at regular intervals such that apexes thereof meet each other.

In the three reflective layers, by continuously changing the reflection center wavelengths, reflected light can also be continuously changed.

In the optical filter layer 20 shown in FIG. 2, three reflective layers are provided, and the number of the reflective layers is not limited to three and may be four or more.

In the support substrate 21, optical characteristics in a region 25 where the reflective layer is not provided are not particularly limited. The region 25 may reflect light in an infrared range, may reflect light in an ultraviolet range, or may allow transmission of light in an infrared range to an ultraviolet range.

As described below, the optical filter layer 20 may be configured to include, on the support substrate 21, a reflective layer that is formed of a cholesteric liquid crystal layer having at least two different reflection center wavelengths. In the case of a reflective layer in which the reflection center wavelength continuously changes, the number of the reflective layers may be one or plural.

The patterned retardation layer 22 shown in FIG. 3 has a slow axis in a direction corresponding to the reflection center wavelength of the reflective layer. Therefore, in the patterned retardation layer 22, the direction of the slow axis changes depending on the reflection center wavelengths of the reflective layers. For example, in a case where the reflection center wavelengths of the reflective layers are 500 nm, 600 nm, and 700 nm, the direction of the slow axis of the reflective layer where the reflection center wavelength is 500 nm, the direction of the slow axis of the reflective layer where the reflection center wavelength is 600 nm, and the direction of the slow axis of the reflective layer where the reflection center wavelength is 700 nm do not match each other and are different from each other.

In addition, the patterned retardation layer 22 has a function of giving a phase difference of, for example, λ/4 to light (circularly polarized light) transmitted through the optical filter layer 20.

In the patterned retardation layer 22, retardation layers 26a, 26b, and 26c are provided on a support substrate 23 at positions corresponding to the reflective layers 24R, 24G, and 24B of the optical filter layer 20. Directions of lines in the retardation layers 26a, 26b, and 26c represent directions of the slow axes.

In the optical filter layer 20 shown in FIG. 2, the three reflective layers 24R, 24G, and 24B are provided, and the patterned retardation layer 22 shown in FIG. 3 also includes the three retardation layers 26a, 26b, and 26c. The reflective layer 24R corresponds to the retardation layer 26a, the reflective layer 24G corresponds to the retardation layer 26b, and the reflective layer 24B corresponds to the retardation layer 26c. The three retardation layers 26a, 26b, and 26c have a triangular shape and are disposed at regular intervals such that apexes thereof meet each other.

The reflective layers 24R, 24G, and 24B have the same size and shape as the retardation layers 26a, 26b, and 26c. Therefore, in a case where the optical filter layer 20 and the patterned retardation layer 22 are laminated, the reflective layers and the retardation layers overlap each other.

The three retardation layers 26a, 26b, and 26c are λ/4 phase difference regions although the directions of the slow axes thereof different from each other. The λ/4 phase difference region refers to a region having a wavelength in a controlled wavelength range, preferably, a length that is ¼ of a center wavelength in the controlled wavelength range, or an in-plane retardation of "center wavelength×n±¼ of the center wavelength (n represents an integer of 0 or 1 or more)". For example, in a case where the center wavelength in the controlled wavelength range is 1000 nm, the retardation layers having phase differences of 250 nm, 750 nm, 1250 nm, and 1750 nm can be used as λ/4 retardation layers.

The patterned retardation layer 22 is not limited to giving a phase difference of λ/4. In the patterned retardation layer 22, for example, the value Re of the in-plane retardation having a phase difference is 138 nm. The value Re of the in-plane retardation is a value at a measurement wavelength of 550 nm.

In the support substrate 23 of the patterned retardation layer 22, optical characteristics in a region 27 where the retardation layers 26a, 26b, and 26c are not provided are not particularly limited. The region 27 may reflect light in an infrared range as in the region 25, may reflect light in an ultraviolet range, or may allow transmission of light in an infrared range to an ultraviolet range.

In the optical filter layer 20 shown in FIG. 2, the reflection center wavelengths of the three reflective layers 24R, 24G, and 24B are different from each other. Therefore, the directions of the slow axes in the three retardation layers are different from each other. For example, the direction of the slow axis in the retardation layer 26a is 45°, the direction of the slow axis in the retardation layer 26b is 90°, and the direction of the slow axis in the retardation layer 26c is 0°. The direction of the slow axis will be described below.

In a case where the directions of the slow axes are represented by angles and a difference between the angles is 10°, the directions of the slow axes are different from each other.

In the optical filter layer 20, in a case where the number of kinds of the reflective layers where the reflection center wavelengths are different from each other is small, it is preferable that a difference between the directions of the slow axes is large. In a case where the difference between the directions of the slow axes of the reflective layers is large, the reflective layers are easily specified, and the detection accuracy of the reflective layers is improved. Therefore, a high-quality multispectral image can be easily obtained.

In the filter 12 shown in FIG. 1, light (circularly polarized light) transmitted through the reflective layers 24R, 24G, and 24B of the optical filter layer 20 shown in FIG. 2 passes through the retardation layers 26a, 26b, and 26c of the patterned retardation layer 22 shown in FIG. 3, and is converted into polarized light corresponding to the directions of the slow axes. The light transmitted through the reflective layers 24R, 24G, and 24B of the optical filter layer 20 is circularly polarized light. Therefore, in a case where the patterned retardation layer 22 gives a phase difference of λ/4, the light is converted into linearly polarized light. As a result, color information based on the reflection center wavelengths of the reflective layers and polarization information based on the retardation layers of the patterned retardation layer 22 can be given to, for example, the light carrying the information of the subject Oj such as reflected light of the subject Oj.

Next, the direction of the slow axis will be described.

Figure 4:
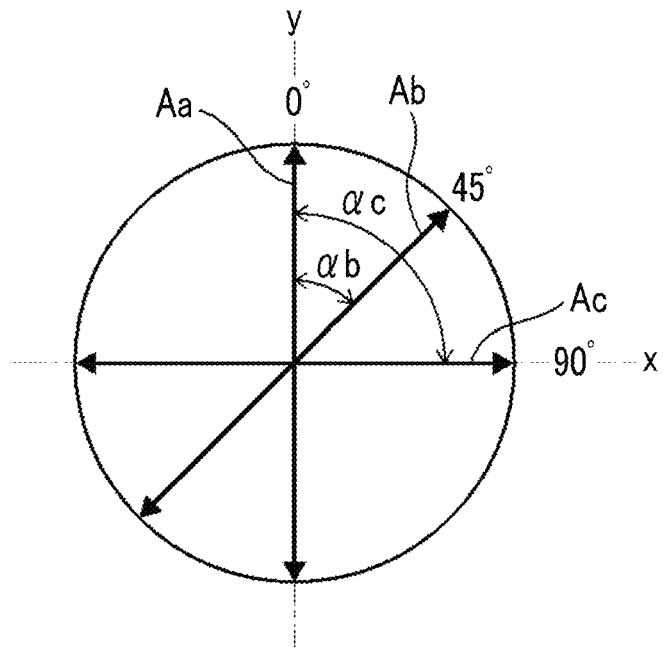
FIG. 4 is a schematic diagram showing a slow axis of the patterned retardation layer in the filter according to the embodiment of the present invention.

FIG. 4 is a schematic diagram showing the slow axis of the patterned retardation layer in the filter according to the embodiment of the present invention. "Slow axis" refers to an axis showing a direction in which the refractive index is the maximum.

The direction of the slow axis is represented by an angle (azimuthal angle) between the slow axis and the y-axis in an xy plane perpendicular to the optical axis L (refer to FIG. 1), that is, the z direction. The direction of the slow axis is an angle based on the y-axis and is measured clockwise. In FIG. 4, reference numerals Aa, Ab, and Ac represent the slow axes of the patterned retardation layer 22. An angle αb is 45°, and an angle αc is 90°. The angle of the slow axis Aa is 0°, the angle of the slow axis Ab is 45°, and the angle of the slow axis Ac is 90°. Light having the angle in the direction of the slow axis is transmitted.

<Polarization Image Sensor>

Figure 5:
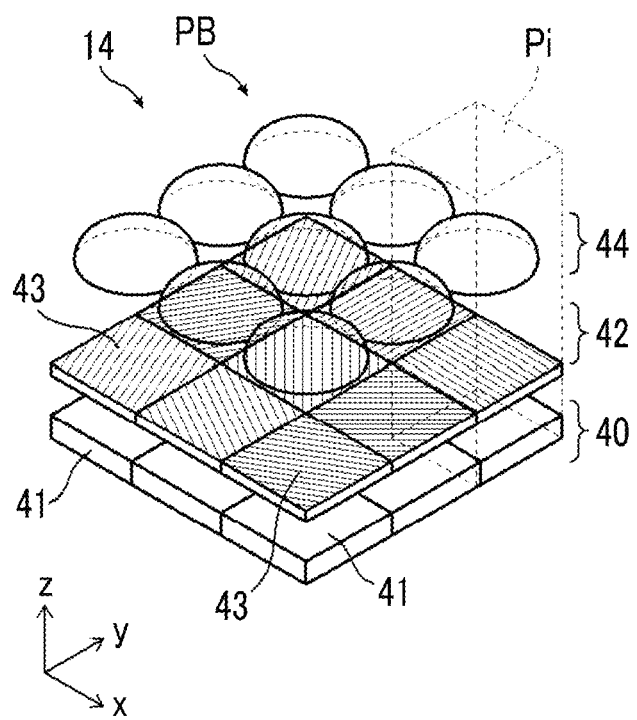
FIG. 5 is a schematic perspective view showing an example of a polarization image sensor in an imaging apparatus according to the embodiment of the present invention.
Figure 6:
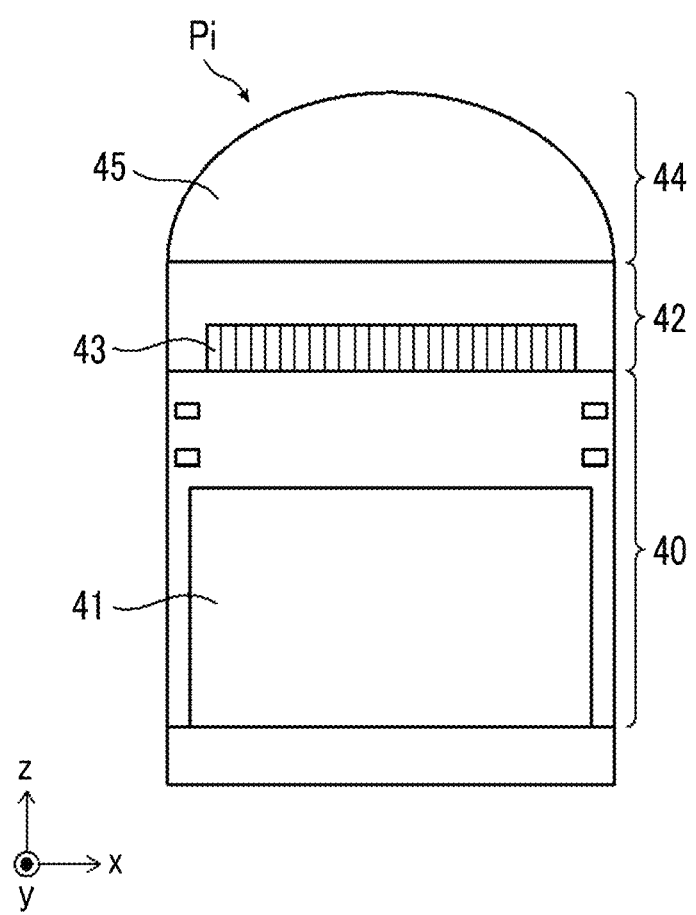
FIG. 6 is a schematic cross-sectional view showing one pixel of the polarization image sensor in the imaging apparatus according to the embodiment of the present invention.

FIG. 5 is a schematic perspective view showing an example of the polarization image sensor in the imaging apparatus according to the embodiment of the present invention. FIG. 6 is a schematic cross-sectional view showing one pixel of the polarization image sensor in the imaging apparatus according to the embodiment of the present invention.

The polarization image sensor 14 is a sensor that detects light passing through the filter 12 (refer to FIG. 1) and focused as described above. The polarization information is associated with the color information of the subject Oj by the polarization image sensor 14 and the filter 12 such that the polarization information associated with the color information can be obtained.

The polarization image sensor 14 includes a plurality of pixels Pi on a light-receiving surface, and focused light is received in each of the pixels Pi. The pixels Pi are regularly arranged at a constant pitch in the x direction and the y direction. Here, i of the pixels Pi represents an integer of 1 or more.

In the polarization image sensor 14 according to the embodiment, for example, one pixel block PB is formed by adjacent 9 pixels Pi. The pixel blocks PB are regularly arranged in the x direction and the y direction. The number of pixels forming the pixel block PB is not limited to 9.

The polarization image sensor 14 includes a pixel array layer 40, a polarization filter element array layer 42, and a microlens array layer 44. The pixel array layer 40, the polarization filter element array layer 42, and the microlens array layer 44 are disposed in this order from an image plane side to an object side.

The pixel array layer 40 has a configuration in which a plurality of photodiodes 41 are two-dimensionally arranged. One photodiode 41 forms one pixel. The photodiodes 41 are regularly disposed in the x direction and the y direction.

In the polarization filter element array layer 42, polarization filter elements 43 having different polarization directions (transmission polarization direction) are two-dimensionally arranged.

The polarization filter elements 43 are disposed at the same intervals as those of the photodiodes 41, and each of the polarization filter elements 43 is provided for each pixel. In each of the pixel blocks PB, the polarization filter elements 43 are regularly arranged.

Plural kinds of polarization filter elements 43 in which polarization directions (transmission polarization directions) of light to be transmitted are different are present. In the pixel block PB, it is preferable that all kinds of the polarization filter elements 43 are disposed. The polarization directions of the polarization filter elements 43 to be disposed may match or may not match the directions of the slow axes of the retardation layers 26a, 26b, and 26c (refer to FIG. 3) of the patterned retardation layer 22.

In a case where the polarization directions of the polarization filter elements 43 match the directions of the slow axes of the retardation layers 26a, 26b, and 26c (refer to FIG. 3) of the patterned retardation layer 22, the retardation layers 26a, 26b, and 26c can be specified depending on whether or not light transmitted through the retardation layers 26a, 26b, and 26c transmits through the polarization filter elements 43 of the polarization image sensor 14.

In a case where the polarization directions of the polarization filter elements 43 do not match the directions of the slow axes of the retardation layers 26a, 26b, and 26c (refer to FIG. 3) of the patterned retardation layer 22, it is necessary to obtain a relationship between the directions of the slow axes of the retardation layers 26a, 26b, and 26c and the polarization directions of the polarization filter elements 43 in advance. For example, white light is produced at a position of the subject Oj shown in FIG. 1 and transmits through the optical filter layer 20 of the filter 12 and the retardation layers 26a, 26b, and 26c of the patterned retardation layer 22. Regarding this transmitted light, the amount of transmitted light in each of the plurality of polarization filter elements 43 of the one pixel block PB shown in FIG. 5 is obtained.

The microlens array layer 44 shown in FIG. 5 is configured by two-dimensionally arranging a plurality of microlenses 45. The microlenses 45 are disposed at the same intervals as those of the photodiodes 41, and each of the microlenses 45 is provided for each pixel. The microlenses 45 are provided in order to efficiently collect light that is transmitted through the filter 12 and focused in the photodiodes 41.

<Processing Unit>

Figure 7:
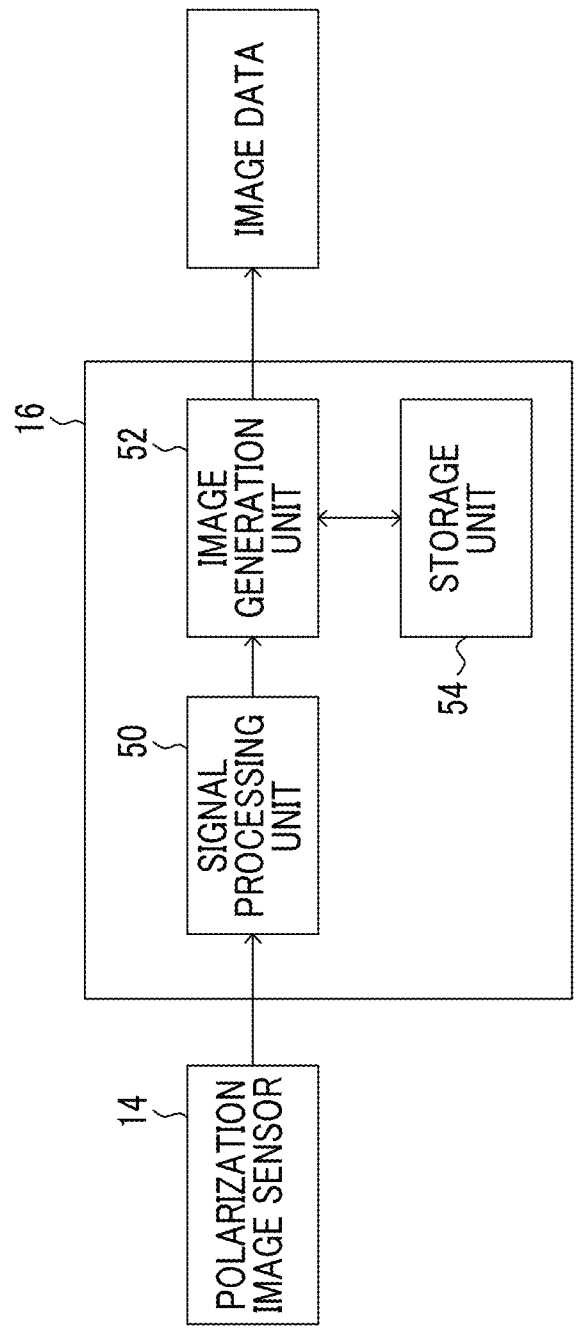
FIG. 7 is a schematic diagram showing an example of a processing unit in the imaging apparatus according to the embodiment of the present invention.

FIG. 7 is a schematic diagram showing an example of the processing unit in the imaging apparatus according to the embodiment of the present invention.

The processing unit 16 processes the signal output from the polarization image sensor 14 and generates image data of the subject Oj. The processing unit 16 includes a signal processing unit 50, an image generation unit 52, and a storage unit 54.

The signal processing unit 50 takes in an analog pixel signal output from each of the pixels of the polarization image sensor 14, performs predetermined signal processing such as correlated double sampling or amplification, converts the pixel signal into a digital signal, and outputs the digital signal.

The image generation unit 52 performs predetermined signal processing on the pixel signal as the converted digital signal and generates image data of the subject Oj.

The storage unit 54 stores the image data generated by the image generation unit 52, and is configured with, for example, a semiconductor memory used in a personal computer or the like. The storage unit 54 is not limited to storing the image data, and may store a program, signal processing conditions, or the like required for the signal processing of the image generation unit 52. Further, the storage unit 54 may store a relationship between the light transmitted through the retardation layers 26a, 26b, and 26c (refer to FIG. 3) and the amounts of transmitted light in the plurality of polarization filter elements 43 (refer to FIG. 5) of one pixel block PB (refer to FIG. 5). It is preferable that the relationship between the light transmitted through the retardation layers 26a, 26b, and 26c and the amounts of transmitted light in the plurality of polarization filter elements 43 is appropriately updated depending on the use frequency of the imaging apparatus 10 (refer to FIG. 1), the replacement of the polarization image sensor 14, or the like. The updated relationship is stored in the storage unit 54 for each update.

In the imaging apparatus 10 shown in FIG. 1, the polarization information is associated with the color information of the subject Oj by the filter 12, and the polarization information associated with the color information can be obtained by the polarization image sensor 14. Thus, each color information can be obtained without color mixing and the like. As a result, in the imaging apparatus 10, a higher-quality multispectral image of the subject Oj in which the tint of the image is uniform can be obtained.

[Second Example of Filter]

Figure 8:
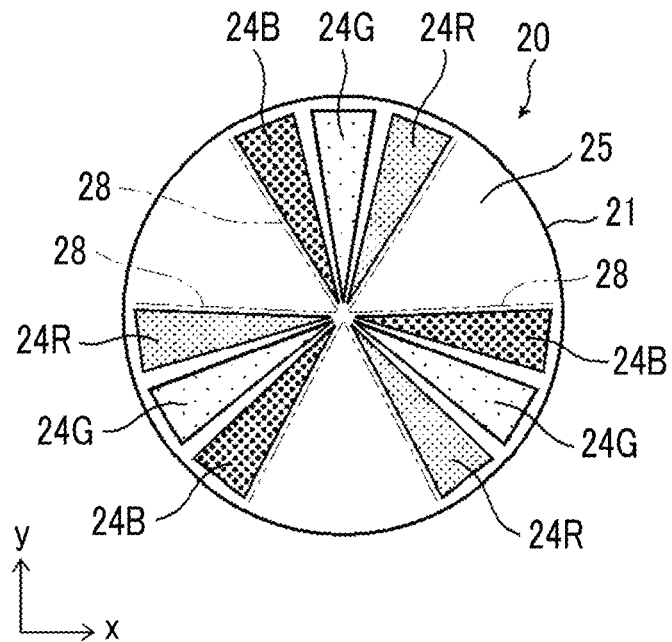
FIG. 8 is a schematic diagram showing a second example of the optical filter layer in the filter according to the embodiment of the present invention.
Figure 9:
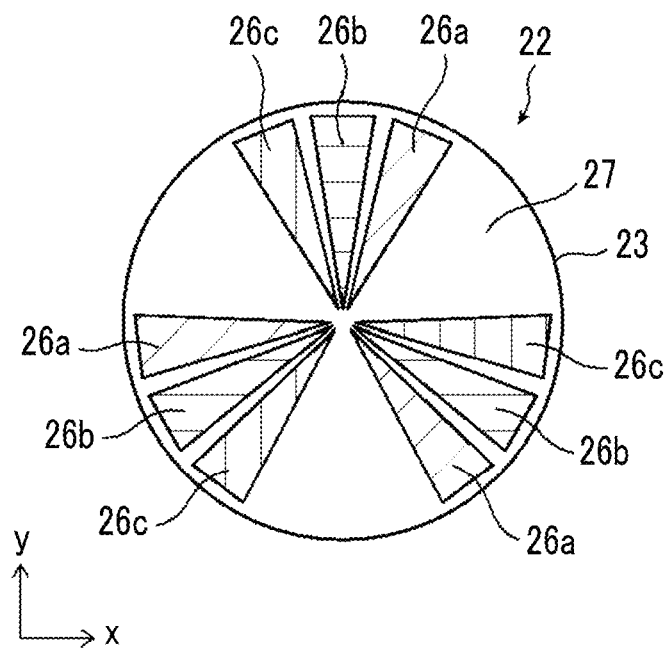
FIG. 9 is a schematic diagram showing a second example of the patterned retardation layer in the filter according to the embodiment of the present invention.

FIG. 8 is a schematic diagram showing a second example of the optical filter layer in the filter according to the embodiment of the present invention, and FIG. 9 is a schematic diagram showing a second example of the patterned retardation layer in the filter according to the embodiment of the present invention.

In FIG. 8, the same structures as those of the optical filter layer 20 of the first example shown in FIG. 2 will be represented by the same reference numerals, and the detailed description thereof will not be repeated. In addition, in FIG. 9, the same structures as those of the patterned retardation layer 22 of the first example shown in FIG. 3 will be represented by the same reference numerals, and the detailed description thereof will not be repeated.

In the optical filter layer 20 of the second example shown in FIG. 8, the three reflective layers 24R, 24G, and 24B are collectively disposed as one set. A region where the three reflective layers 24R, 24G, and 24B are collectively disposed as one set will be referred to as a compartment 28. In the optical filter layer 20, three compartments 28 are present, and nine reflective layers in total are provided. The reflective layer 24R, the reflective layer 24G, and the reflective layer 24B have the same size and shape.

In the patterned retardation layer 22 of the second example shown in FIG. 9, the retardation layers 26a, 26b, and 26c are disposed corresponding to the reflective layers of the optical filter layer 20 shown in FIG. 8. The retardation layer 26a is disposed relative to the reflective layer 24R, the retardation layer 26b is disposed relative to the reflective layer 24G, and the retardation layer 26c is disposed relative to the reflective layer 24B. The patterned retardation layer 22 includes nine retardation layers in total.

The compartment 28 has a fan shape, and three compartments 28 are disposed at regular intervals such that apexes thereof meet each other. However, the shape of the compartment is not limited to a fan shape and may be a triangular shape or a circular shape as described below.

[Third Example of Filter]

Figure 10:
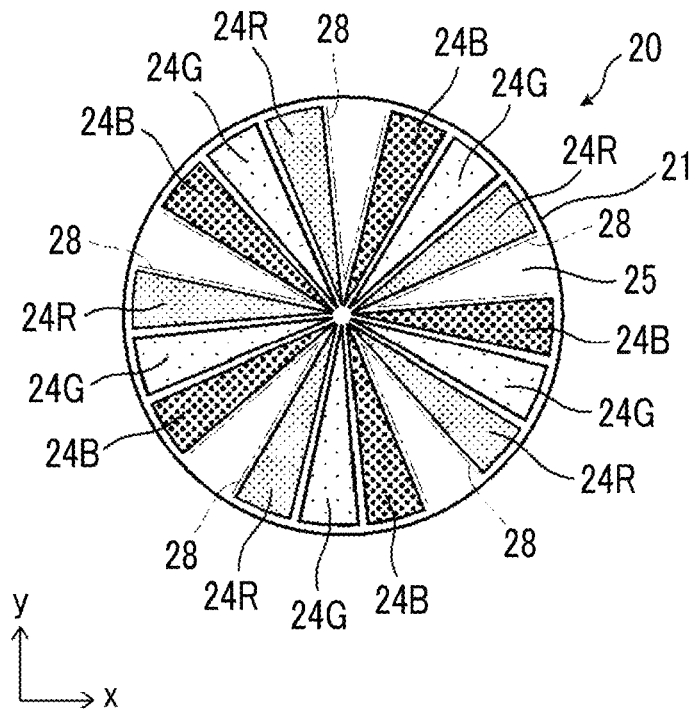
FIG. 10 is a schematic diagram showing a third example of the optical filter layer in the filter according to the embodiment of the present invention.

FIG. 10 is a schematic diagram showing a third example of the optical filter layer in the filter according to the embodiment of the present invention.

In FIG. 10, the same structures as those of the optical filter layer 20 of the second example shown in FIG. 8 will be represented by the same reference numerals, and the detailed description thereof will not be repeated.

The optical filter layer 20 of the third example shown in FIG. 10 is different from the optical filter layer 20 of the second example shown in FIG. 8 in the number of the compartments 28, and the other configurations are the same as those of the optical filter layer 20 of the second example shown in FIG. 8. The optical filter layer 20 of the third example shown in FIG. 10 includes five compartments 28. The reflective layer 24R, the reflective layer 24G, and the reflective layer 24B have the same size and shape.

Although not shown in the drawing, the patterned retardation layer 22 corresponding to the optical filter layer 20 of the third example shown in FIG. 10 is the same as the patterned retardation layer 22 shown in FIG. 9, except that the number of retardation layers 26 is different. Therefore, the detailed description will not be repeated.

[Fourth Example of Filter]

The optical filter layer 20 may be configured to include, on the support substrate 21, a reflective layer that is formed of a cholesteric liquid crystal layer having at least two different reflection center wavelengths.

Figure 11:
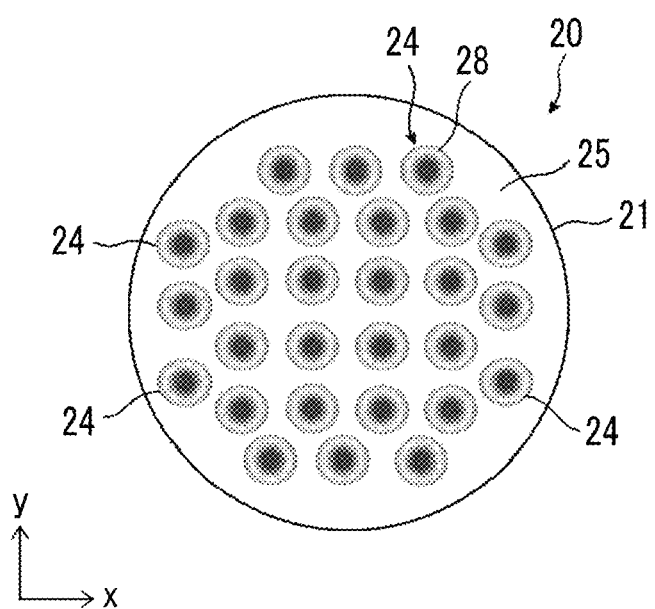
FIG. 11 is a schematic diagram showing a fourth example of the optical filter layer in the filter according to the embodiment of the present invention.
Figure 12:
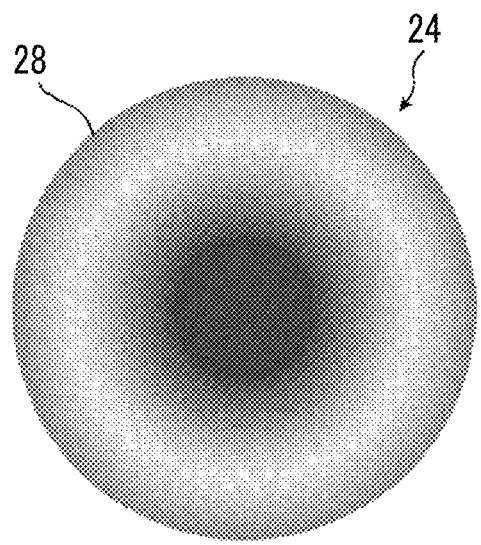
FIG. 12 is a schematic enlarged view showing the fourth example of the optical filter layer in the filter according to the embodiment of the present invention.

FIG. 11 is a schematic diagram showing a fourth example of the optical filter layer in the filter according to the embodiment of the present invention, and FIG. 12 is a schematic enlarged view showing a fourth example of the optical filter layer in the filter according to the embodiment of the present invention.

In FIGS. 11 and 12, the same structures as those of the optical filter layer 20 of the first example shown in FIG. 2 will be represented by the same reference numerals, and the detailed description thereof will not be repeated.

The optical filter layer 20 of the fourth example shown in FIGS. 11 and 12 is different from the optical filter layer 20 of the first example shown in FIG. 2 in that a circular reflective layer 24 is provided and that the reflection center wavelength of the reflective layer 24 continuously changes, and the other configurations are the same as those of the optical filter layer 20 shown in FIG. 2.

The number of circular reflective layers 24 is not particularly limited and may be one or plural. For example, the number of the reflective layers 24 is 1000. In addition, in order to reduce the influence of diffraction caused by the reflective layers 24, it is preferable that the size of the reflective layers 24 is reduced and the reflective layers 24 are disposed such that the entire area of the support substrate 21 of the optical filter layer 20 is covered.

In a case where one reflective layer 24 is provided, it is preferable that the size of the reflective layer 24 is determined such that the entire area of the support substrate 21 of the optical filter layer 20 is covered. A region where the circular reflective layer 24 is formed will also be referred to as the compartment 28.

Figure 13:
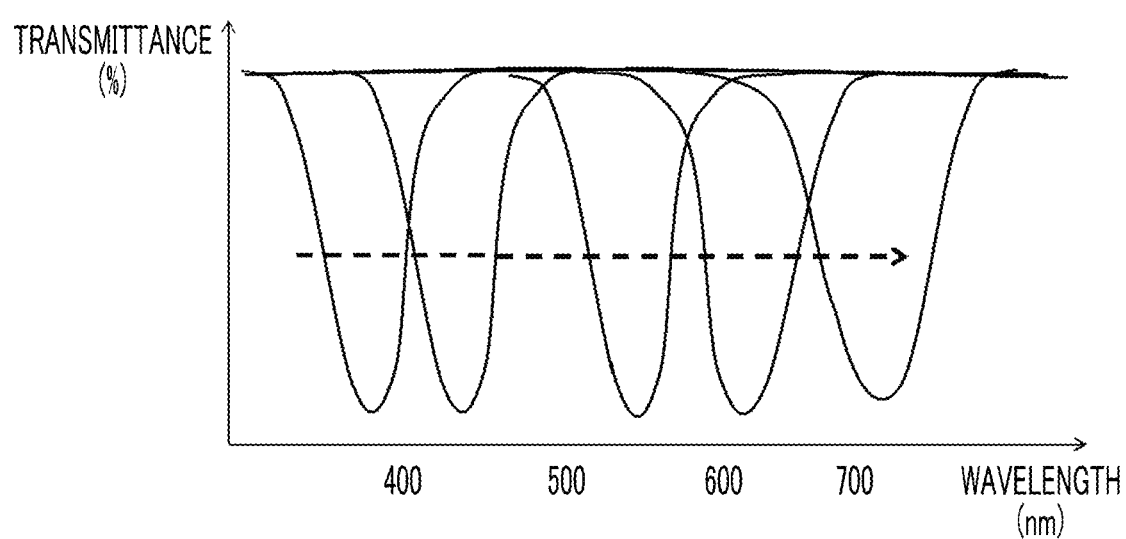
FIG. 13 is a graph showing an example of a reflection center wavelength of the optical filter layer according to the embodiment of the present invention.

In the circular reflective layer 24, for example, the reflection center wavelength continuously changes in a radial shape starting from the center of the reflective layer 24. The continuous change in the reflection center wavelength refers to a continuous change in the reflection center wavelength in a two-dimensional plane of a surface of the reflective layer 24 as shown in FIG. 13. The continuous change in the reflection center wavelength of the reflective layer 24 can realize, for example, a continuous change in helical pitch in a cholesteric liquid crystalline phase. In FIG. 13, the arrow indicates the direction of the slow axis of the retardation layer. In the cholesteric liquid crystalline phase, the helical pitch is continuously changed using the fact that the helical pitch changes by changing the irradiation dose of ultraviolet light.

Figure 14:
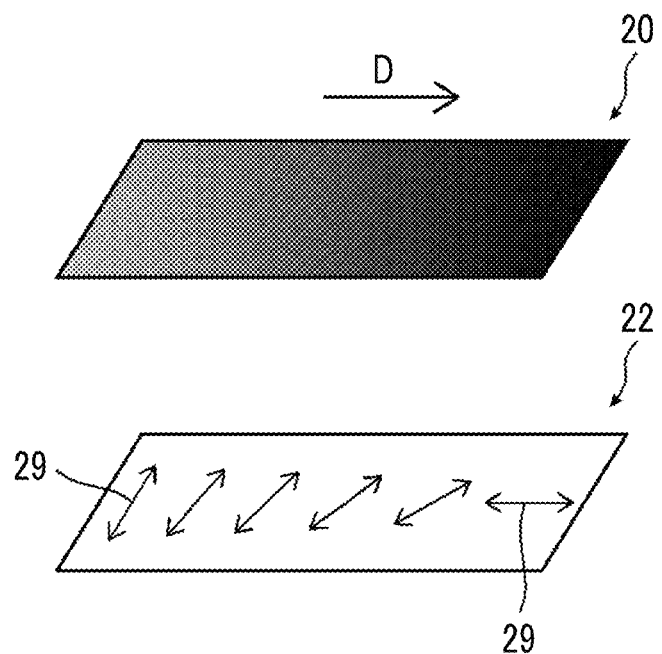
FIG. 14 is a schematic diagram showing a change in the color of the optical filter layer and a change in the slow axis of the patterned retardation layer according to the embodiment of the present invention.

Although not shown in the drawings, the retardation layer 26 is disposed relative to the circular reflective layer 24 at a position of the patterned retardation layer 22 corresponding to the circular reflective layer 24. In the retardation layer 26, the slow axis corresponding to the reflection center wavelength continuously changes. For example, as schematically shown in FIG. 14, in a case where the color of the optical filter layer 20 continuously changes in a direction D, that is, in a case where the reflection center wavelength continuously changes, the direction of a slow axis 29 in the patterned retardation layer 22 changes.

"Continuous" regarding the continuous change in the reflection center wavelength represents that a difference in the peak wavelength of the reflection center wavelength is 100 nm or less.

[Fifth Example of Filter]

Figure 15:
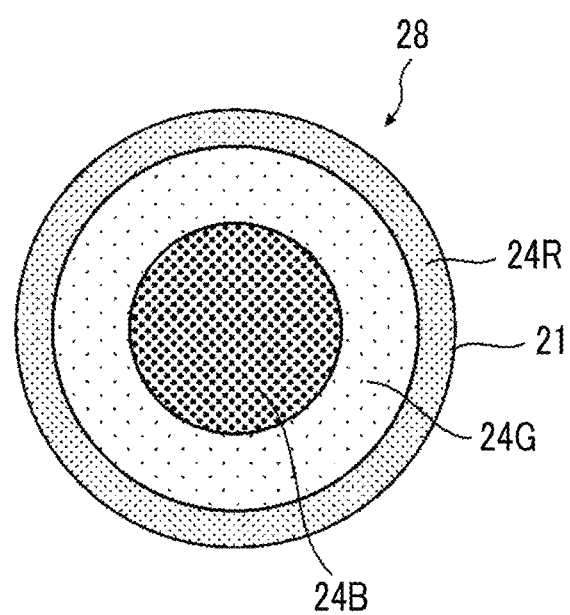
FIG. 15 is a schematic diagram showing a fifth example of the optical filter layer in the filter according to the embodiment of the present invention.
Figure 16:
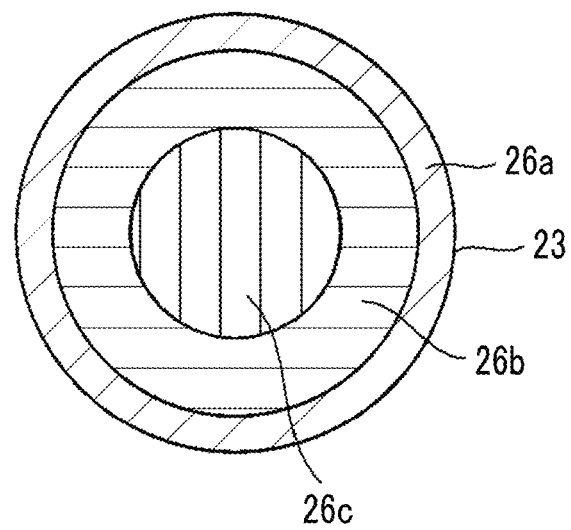
FIG. 16 is a schematic enlarged view showing a fifth example of the patterned retardation layer in the filter according to the embodiment of the present invention.

FIG. 15 is a schematic diagram showing a fifth example of the optical filter layer in the filter according to the embodiment of the present invention, and FIG. 16 is a schematic enlarged view showing a fifth example of the patterned retardation layer in the filter according to the embodiment of the present invention. FIG. 15 shows one compartment 28, and FIG. 16 shows a retardation layer corresponding to the compartment 28 in FIG. 15.

In FIG. 15, the same structures as those of the optical filter layer 20 of the fourth example shown in FIGS. 11 and 12 will be represented by the same reference numerals, and the detailed description thereof will not be repeated.

In FIG. 16, the same structures as those of the patterned retardation layer 22 of the first example shown in FIG. 3 will be represented by the same reference numerals, and the detailed description thereof will not be repeated.

The optical filter layer 20 of the fifth example shown in FIG. 15 is different from the optical filter layer 20 of the fourth example shown in FIGS. 11 and 12 in that the reflection center wavelength does not continuously change, and the other configurations are the same as those of the optical filter layer 20 shown in FIGS. 11 and 12.

In the optical filter layer 20 of the fifth example, a plurality of reflective layers in which the reflection center wavelengths are different are provided in a radial shape starting from the center of one compartment 28. For example, as shown in FIG. 15, three reflective layers 24R, 24G, and 24B are concentrically provided in the compartment 28.

The reflective layer 24B is disposed at the center of the compartment 28, the reflective layer 24G is disposed outside the reflective layer 24B, and the reflective layer 24R is disposed outside the reflective layer 24G. In this case, in the patterned retardation layer 22, as shown in FIG. 16, the retardation layer 26c is disposed at the center, the retardation layer 26b is disposed outside the retardation layer 26c, and the retardation layer 26a is disposed outside the retardation layer 26b, so as to correspond to the three reflective layers 24R, 24G, and 24B.

This way, in a case where the reflective layers 24 of the optical filter layer 20 have a circular shape, the reflection center wavelength is not limited to continuously changing, and a combination of reflective layers in which the center wavelength is not discontinuous may be adopted.

The optical filter layer 20 and the patterned retardation layer 22 according to any one of the examples include the support substrate 21 and the support substrate 23, but the present invention is not limited thereto. The reflective layers may be provided on the retardation layers without providing the support substrate 21 of the optical filter layer 20.

The number of the reflective layers is three in the optical filter layer 20 shown in FIG. 2, the number of the reflective layers is nine in the optical filter layer 20 shown in FIG. 8, and the number of the reflective layers is 15 in the optical filter layer 20 shown in FIG. 10. In a case where one reflective layer has only one reflection center wavelength, the number of the reflective layers only has to be at least three and is preferably 6 or more and more preferably 12 or more. The upper limit of the number of the reflective layers is not particularly limited, and the minimum size of a reflecting region is realistically about 300 μm. Assuming that the lens diameter is 15 mm, in a case where reflective layers are provided on substantially the entire lens surface, the number of the reflective layers is 2000. Therefore, the upper limit value of the number of the reflective layers is about 2000 but may be 1500 or less.

In the optical filter layer 20 shown in FIG. 11, the number of the reflective layers is, for example, 1000. In a case where one reflective layer has a plurality of reflection center wavelengths, the number of the reflective layers only has to be at least one and is preferably 100 or more and more preferably 500 or more. The upper limit of the number of the reflective layers is not particularly limited, and the minimum size of the reflecting region is realistically about 300 μm as described above. Therefore, assuming that the lens diameter is 15 mm, the upper limit value is about 2000 or less and may be 1500 or less.

[Other Examples of Imaging Apparatus]

Figure 17:
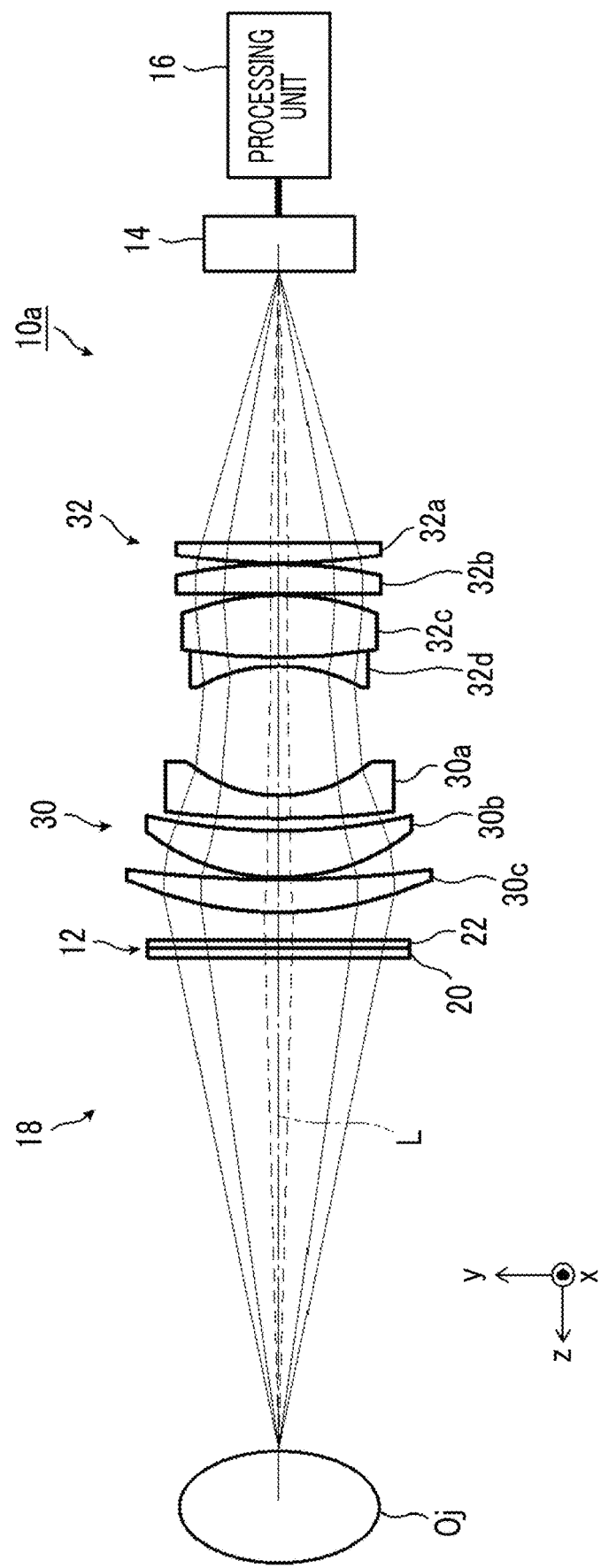
FIG. 17 is a schematic diagram showing another example of the imaging apparatus including the filter according to the embodiment of the present invention.

FIG. 17 is a schematic diagram showing another example of the imaging apparatus including the filter according to an embodiment of the present invention.

In an imaging apparatus 10a shown in FIG. 17, the same structures as those of the imaging apparatus 10 shown in FIG. 1 will be represented by the same reference numerals, and the detailed description thereof will not be repeated.

The imaging apparatus 10a shown in FIG. 17 is different from the imaging apparatus 10 shown in FIG. 1 in the position where the filter 12 is disposed, and the other configurations are the same as those of the imaging apparatus 10 shown in FIG. 1.

In the imaging apparatus 10a shown in FIG. 17, the filter 12 is disposed on the subject Oj side of the convex surface of the lens 30c of the first lens group 30 instead of the pupil position of the optical system 18. Even in a case where the filter 12 is disposed at this position, as in the imaging apparatus 10 shown in FIG. 1, color information based on the reflection center wavelengths of the reflective layers and polarization information based on the retardation layers of the patterned retardation layer 22 can be given to the light carrying the information of the subject Oj such as reflected light of the subject Oj by the filter 12, and the image data of the subject Oj, that is, the image data representing a multi-spectral image of the subject Oj can be obtained.

The optical system where the filter 12 is disposed is not limited to the configurations shown in FIGS. 1 and 17 and only has to be configured to have the function of focusing the light carrying the information of the subject Oj that passes through the filter 12 on the polarization image sensor 14.

Both of the imaging apparatus 10 and the imaging apparatus 10a can convert the color information of the subject Oj into polarization information to obtain the polarization information of the subject Oj. However, both of the imaging apparatus 10 and the imaging apparatus 10a can also convert a polarization state into color information. In this case, an image sensor (not shown) is disposed at the position of the subject Oj, and the subject Oj is disposed at the position of the image sensor. The image sensor includes an imaging element such as a charge coupled device (CCD) or a complementary metal oxide semiconductor (CMOS), and a processing unit for obtaining an image of the subject Oj is connected to the image sensor. The optical filter layer 20 is disposed on the image sensor side, and the patterned retardation layer 22 is disposed on the subject Oj side.

In the above-described configuration, the light carrying the information of the subject Oj such as reflected light from the subject Oj transmits through the patterned retardation layer 22. In this case, polarization information based on the retardation layers of the patterned retardation layer 22 is given to the light. In a case where the light carrying the information of the subject Oj to which the polarization information is given transmits through the optical filter layer 20, color information based on the reflection center wavelength of the reflective layer is given to the light by the optical filter layer 20. The color information is associated with the polarization information of the subject Oj by the image sensor, and the color information associated with the polarization information can be obtained.

Hereinafter, the configuration of the reflective layer, the configuration of the retardation layer, the method of manufacturing the filter, and the like will be described.

[Reflective Layer]

The reflective layer is a cholesteric liquid crystal layer obtained by immobilizing a cholesteric liquid crystalline phase.

The center wavelength λ of selective reflection (selective reflection center wavelength λ) of the cholesteric liquid crystalline phase depends on a pitch P (=helical period) of a helical structure in the cholesteric liquid crystalline phase and satisfies a relationship of $\lambda = n \times P$ with an average refractive index n of the cholesteric liquid crystalline phase. Therefore, the selective reflection center wavelength can be adjusted by adjusting the helical pitch of the helical structure. By continuously changing the helical pitch, the reflection center wavelength of the cholesteric liquid crystal layer can be continuously changed.

The pitch of the cholesteric liquid crystalline phase depends on the kind of a chiral agent which is used in combination of a polymerizable liquid crystal compound, or the concentration of the chiral agent added. Therefore, a desired pitch can be obtained by adjusting the kind and concentration of the chiral agent.

In addition, a half-width Δλ (nm) of a selective reflection range (circularly polarized light reflection range) where selective reflection is exhibited depends on a refractive index anisotropy Δn of the cholesteric liquid crystalline phase and the helical pitch P and satisfies a relationship of $\Delta\lambda = \Delta n \times P$. Therefore, the width of the selective reflection range can be controlled by adjusting the refractive index anisotropy Δn of the cholesteric liquid crystalline phase. The refractive index anisotropy Δn can be adjusted by adjusting a kind of a liquid crystal compound for forming the reflective layer 24 and a mixing ratio thereof, and a temperature during aligned immobilization.

As a method of measuring a helical sense and a helical pitch, a method described in "Introduction to Experimental Liquid Crystal Chemistry", (the Japanese Liquid Crystal Society, 2007, Sigma Publishing Co., Ltd.), p. 46, and "Liquid Crystal Handbook" (the Editing Committee of Liquid Crystal Handbook, Maruzen Publishing Co., Ltd.), p. 196 can be used.

The center wavelength of selective reflection, that is, the reflection center wavelength and the half-width of the cholesteric liquid crystal layer can be obtained as follows.

In a case where a reflection spectrum (measured from a normal direction of the cholesteric liquid crystal layer) of the cholesteric liquid crystal layer is measured using a spectrophotometer (V-670, manufactured by Jasco Corporation), a decreased peak of transmittance in the selective reflection range is observed. In a case where, among two wavelengths that are intermediate (average) transmittances between the minimum transmittance and the transmittance before a decrease of the peak, the value of the wavelength on the shorter wavelength side is represented $\lambda_l$ (nm) and the value of the wavelength on the longer wavelength side is represented $\lambda_h$ (nm), the center wavelength of selective reflection (nm) and the half-width Δλ (nm) can be represented by the following expression.

$$\lambda = (\lambda_l + \lambda_h)/2 \quad \Delta\lambda = (\lambda_h - \lambda_l)$$

The center wavelength of selective reflection obtained as described above substantially matches a wavelength at a centroid position of the reflection peak in the circular polarization reflection spectrum measured from the normal direction of the cholesteric liquid crystal layer.

Reflected light of the cholesteric liquid crystalline phase is circularly polarized light. Whether or not the reflected circularly polarized light is right circularly polarized light or left circularly polarized light is determined depending on a helical twisted direction of the cholesteric liquid crystalline phase. Regarding the selective reflection of the circularly polarized light by the cholesteric liquid crystalline phase, in a case where the helical twisted direction of the cholesteric liquid crystalline phase is right, right circularly polarized light is reflected, and in a case where the helical twisted direction of the cholesteric liquid crystalline phase is left, left circularly polarized light is reflected.

The reflective layer may be a cholesteric liquid crystal layer that reflects right circularly polarized light or may be a cholesteric liquid crystal layer that reflects left circularly polarized light. Alternatively, the reflective layer may be a laminate in which a cholesteric liquid crystal layer that reflects right circularly polarized light and a cholesteric liquid crystal layer that reflects left circularly polarized light are laminated.

A turning direction of the cholesteric liquid crystalline phase can be adjusted by adjusting at least one of the kind of the liquid crystal compound that forms the reflective layer or the kind of the chiral agent to be added.

The reflective layer 24 may be configured with a monolayer or multiple layers.

A wavelength range of light to be reflected, that is, a wavelength range of light to be blocked can be widened by sequentially laminating layers in which the selective reflection center wavelength λ is shifted. In addition, as a method of changing a helical pitch in a layer stepwise that is called a pitch gradient method, a technique of widening a wavelength range is also known, and specific examples thereof include methods described in Nature 378, 467-469 (1995), JP1994-281814A (JP-H6-281814A), JP4990426B, and the like.

As described above, the reflective layer 24 is a cholesteric liquid crystal layer obtained by immobilizing a cholesteric liquid crystalline phase.

The structure in which a cholesteric liquid crystalline phase is immobilized may be a structure in which the alignment of the liquid crystal compound as a cholesteric liquid crystalline phase is immobilized. Typically, the structure in which a cholesteric liquid crystalline phase is immobilized may be a structure which is obtained by making the polymerizable liquid crystal compound to be in a state where a cholesteric liquid crystalline phase is aligned, polymerizing and curing the polymerizable liquid crystal compound with ultraviolet irradiation, heating, or the like to form a layer having no fluidity, and concurrently changing the state of the polymerizable liquid crystal compound into a state where the alignment state is not changed by an external field or an external force.

The structure in which a cholesteric liquid crystalline phase is immobilized is not particularly limited as long as the optical characteristics of the cholesteric liquid crystalline phase are maintained, and the liquid crystal compound does not necessarily exhibit liquid crystallinity. For example, the molecular weight of the polymerizable liquid crystal compound may be increased by a curing reaction such that the liquid crystallinity thereof is lost.

Examples of a material used for forming the cholesteric liquid crystal layer obtained by immobilizing a cholesteric liquid crystalline phase include a liquid crystal composition including a liquid crystal compound. It is preferable that the liquid crystal compound is a polymerizable liquid crystal compound.

It is preferable that the liquid crystal composition including a liquid crystal compound for forming the cholesteric liquid crystal layer further includes a surfactant. In addition, the liquid crystal composition used for forming the cholesteric liquid crystal layer may further include a chiral agent, a polymerization initiator, an alignment agent, and the like.

In particular, it is preferable that the liquid crystal composition for forming the reflective layer 24 that reflects right circularly polarized light is a polymerizable cholesteric liquid crystal composition including a polymerizable liquid crystal compound, a chiral agent that induces right twisting, and a polymerization initiator. In addition, it is preferable that the liquid crystal composition for forming the reflective layer 24 that reflects left circularly polarized light is a polymerizable cholesteric liquid crystal composition including a polymerizable liquid crystal compound, a chiral agent that induces left twisting, and a polymerization initiator.

—Polymerizable Liquid Crystal Compound—

The polymerizable liquid crystal compound may be a rod-shaped liquid crystal compound or a disk-shaped liquid crystal compound and is preferably a rod-shaped liquid crystal compound.

Examples of the rod-shaped polymerizable liquid crystal compound for forming the cholesteric liquid crystalline phase include a rod-shaped nematic liquid crystal compound. As the rod-shaped nematic liquid crystal compound, an azomethine compound, an azoxy compound, a cyanobiphenyl compound, a cyanophenyl ester compound, a benzoate compound, a phenyl cyclohexanecarboxylate compound, a cyanophenylcyclohexane compound, a cyano-substituted phenylpyrimidine compound, an alkoxy-substituted phenylpyrimidine compound, a phenyldioxane compound, a tolan compound, or an alkenylcyclohexylbenzonitrile compound is preferably used. Not only a low-molecular-weight liquid crystal compound but also a polymer liquid crystal compound can be used.

The polymerizable liquid crystal compound can be obtained by introducing a polymerizable group into the liquid crystal compound. Examples of the polymerizable group include an unsaturated polymerizable group, an epoxy group, and an aziridinyl group. Among these, an unsaturated polymerizable group is preferable, and an ethylenically unsaturated polymerizable group is more preferable. The polymerizable group can be introduced into the molecules of the liquid crystal compound using various methods. The number of polymerizable groups in the polymerizable liquid crystal compound is preferably 1 to 6 and more preferably 1 to 3. Examples of the polymerizable liquid crystal compound include compounds described in Makromol. Chem. (1989), Vol. 190, p. 2255, Advanced Materials (1993), Vol. 5, p. 107, U.S. Pat. Nos. 4,683,327A, 5,622,648A, 5,770,107A, WO1995/22586, WO1995/24455, WO1997/00600, WO1998/23580, WO1998/52905, JP1989-272551A (JP-H1-272551A), JP1994-16616A (JP-H6-16616A), JP 1995-110469A (JP-H7-110469A), JP1999-80081A (JP-H11-80081A), and JP2001-328973A. Two or more polymerizable liquid crystal compounds may be used in combination. In a case where two or more polymerizable liquid crystal compounds are used in combination, the alignment temperature can be decreased.

In addition, the addition amount of the polymerizable liquid crystal compound in the liquid crystal composition is preferably 75% to 99.9 mass %, more preferably 80% to 99 mass %, and still more preferably 85% to 90 mass % with respect to the solid content mass (mass excluding a solvent) of the liquid crystal composition.

—Chiral Agent (Optically Active Compound)—

The chiral agent has a function of causing a helical structure of a cholesteric liquid crystalline phase to be formed. The chiral agent may be selected depending on the purpose because a helical twisted direction or a helical pitch derived from the compound varies.

That is, in a case where the reflective layer 24 that reflects right circularly polarized light is formed, a chiral agent that induces right twisting may be used. In a case where the reflective layer 24 that reflects left circularly polarized light is formed, a chiral agent that induces left twisting may be used.

The chiral agent is not particularly limited, and a well-known compound (for example, Liquid Crystal Device Handbook (No. 142 Committee of Japan Society for the Promotion of Science, 1989), Chapter 3, Article 4-3, chiral agent for twisted nematic (TN) or super twisted nematic (STN), p. 199), isosorbide, or an isomannide derivative can be used.

In general, the chiral agent includes an asymmetric carbon atom. However, an axially asymmetric compound or a planar asymmetric compound not having an asymmetric carbon atom can also be used as the chiral agent. Examples of the axially asymmetric compound or the planar asymmetric compound include binaphthyl, helicene, paracyclophane, and derivatives thereof. The chiral agent may include a polymerizable group. In a case where both the chiral agent and the liquid crystal compound have a polymerizable group, a polymer which includes a repeating unit derived from the polymerizable liquid crystal compound and a repeating unit derived from the chiral agent can be formed due to a polymerization reaction of a polymerizable chiral agent and the polymerizable liquid crystal compound. In this aspect, it is preferable that the polymerizable group in the polymerizable chiral agent is the same as the polymerizable group in the polymerizable liquid crystal compound. Accordingly, the polymerizable group of the chiral agent is preferably an unsaturated polymerizable group, an epoxy group, or an aziridinyl group, more preferably an unsaturated polymerizable group, and still more preferably an ethylenically unsaturated polymerizable group.

In addition, the chiral agent may be a liquid crystal compound.

In a case where the chiral agent includes a photoisomerization group, a pattern having a desired reflection wavelength corresponding to a luminescence wavelength can be formed by irradiation of an actinic ray or the like through a photomask after coating and alignment, which is preferable. As the photoisomerization group, an isomerization portion of a photochromic compound, an azo group, an azoxy group, or a cinnamoyl group is preferable. As a specific compound, compounds described in JP2000-147236A, JP2002-80478A, JP2002-80851A, JP2002-179633A, JP2002-179668A, JP2002-179669A, JP2002-179670A, JP2002-179681A, JP2002-179682A, JP2002-302487A, JP2002-338575A, JP2002-338668A, JP2003-306490A, JP2003-306491A, JP2003-313187A, JP2003-313188A, JP2003-313189A, JP2003-313292A, and the like, can be used.

The content of the chiral agent in the liquid crystal composition is preferably 0.01 to 200 mol % and more preferably 1 to 30 mol % with respect to the amount of the polymerizable liquid crystal compound. The liquid crystal composition may include two or more chiral agents. By mixing a chiral agent having the photoisomerization group and a chiral agent not having the photoisomerization group, the helical twisting power (HTP) and the photoisomerization ability can be adjusted.

—Polymerization Initiator—

In a case where the liquid crystal composition includes a polymerizable compound, it is preferable that the liquid crystal composition includes a polymerization initiator. In an aspect where a polymerization reaction progresses with ultraviolet irradiation, it is preferable that the polymerization initiator to be used is a photopolymerization initiator which can initiate a polymerization reaction with ultraviolet irradiation. Examples of the photopolymerization initiator include an α-carbonyl compound (described in U.S. Pat. Nos. 2,367,661A and 2,367,670A), an acyloin ether (described in U.S. Pat. No. 2,448,828A), an α-hydrocarbon-substituted aromatic acyloin compound (described in U.S. Pat. No. 2,722,512A), a polynuclear quinone compound (described in U.S. Pat. Nos. 3,046,127A and 2,951,758A), a combination of a triarylimidazole dimer and p-aminophenyl ketone (described in U.S. Pat. No. 3,549,367A), an acridine compound and a phenazine compound (described in JP1985-105667A (JP-S60-105667A) and U.S. Pat. No. 4,239,850A), and an oxadiazole compound (described in U.S. Pat. No. 4,212,970A).

The content of the photopolymerization initiator in the liquid crystal composition is preferably 0.1% to 20 mass % and more preferably 0.5% to 12 mass % with respect to the content of the polymerizable liquid crystal compound.

—Crosslinking Agent—

In order to improve the film hardness after curing and to improve durability, the liquid crystal composition may optionally include a crosslinking agent. As the crosslinking agent, a curing agent which can perform curing with ultraviolet light, heat, moisture, or the like can be suitably used.

The crosslinking agent is not particularly limited and can be appropriately selected depending on the purpose. Examples of the crosslinking agent include: a polyfunctional acrylate compound such as trimethylol propane tri(meth)acrylate or pentaerythritol tri(meth)acrylate; an epoxy compound such as glycidyl (meth)acrylate or ethylene glycol diglycidyl ether; an aziridine compound such as 2,2-bis hydroxymethyl butanol-tris[3-(1-aziridinyl)propionate] or 4,4-bis(ethyleneiminocarbonylamino)diphenylmethane; an isocyanate compound such as hexamethylene diisocyanate or a biuret type isocyanate; a polyoxazoline compound having an oxazoline group at a side chain thereof; and an alkoxysilane compound such as vinyl trimethoxysilane or N-(2-aminoethyl)-3-aminopropyltrimethoxysilane. In addition, depending on the reactivity of the crosslinking agent, a well-known catalyst can be used, and not only film hardness and durability but also productivity can be improved. These crosslinking agents, one kind may be used alone or in combination of two or more kinds.

The content of the crosslinking agent is preferably 3% to 20 mass % and more preferably 5% to 15 mass % with respect to the solid content mass of the liquid crystal composition. In a case where the content of the crosslinking agent is in the above-described range, an effect of improving a crosslinking density can be easily obtained, and the stability of a cholesteric liquid crystalline phase is further improved.

—Polymerization Inhibitor—

In order to improve storage stability, the liquid crystal composition may include a polymerization inhibitor.

Examples of the polymerization inhibitor include hydroquinone, hydroquinone monomethyl ether, phenothiazine, benzoquinone, hindered amine (HALS), and derivatives thereof. These polymerization inhibitors may be used alone or in combination of two or more kinds.

The content of the polymerization inhibitor is preferably 0% to 10 mass % and more preferably 0% to 5 mass % with respect to the solid content mass of the liquid crystal composition.

In a case where the cholesteric liquid crystal layer is formed, it is preferable that the liquid crystal composition is used as liquid.

The liquid crystal composition may include a solvent. The solvent is not particularly limited and can be appropriately selected depending on the purpose. An organic solvent is preferably used.

The organic solvent is not particularly limited and can be appropriately selected depending on the purpose. Examples of the organic solvent include a ketone such as methyl ethyl ketone, methyl isobutyl ketone, cyclohexanone, or cyclopentanone, an alkyl halide, an amide, a sulfoxide, a heterocyclic compound, a hydrocarbon, an ester, and an ether. These organic solvents may be used alone or in combination of two or more kinds. Among these, a ketone is preferable in consideration of an environmental burden. The above-described component such as the above-described monofunctional polymerizable monomer may function as the solvent.

Here, as described above, as the chiral agent, a chiral agent having a portion (photoisomerization group) such as a cinnamoyl group that is isomerized by light can be used. In a case where the chiral agent having a photoisomerization group is used as the chiral agent of the liquid crystal composition, the liquid crystal composition may be irradiated with weak patterned ultraviolet light once or more using a mask or the like to isomerize the photoisomerization group after being applied and heated, and then may be irradiated with ultraviolet light to immobilize the cholesteric liquid crystalline phase.

Alternatively, the liquid crystal composition may be irradiated with strong patterned ultraviolet light for immobilizing the cholesteric liquid crystalline phase using a mask or the like so as to be partially cured, a non-exposed portion or the entire surface may be irradiated with weak ultraviolet light to isomerize the photoisomerization group, and then the liquid crystal composition may be irradiated with ultraviolet light for immobilizing the cholesteric liquid crystalline phase.

As a result, in one reflective layer, the reflection center wavelength can be continuously changed by continuously changing the helical pitch. This point will be described below.

In addition, by adjusting a temperature during ultraviolet irradiation, the reflection wavelength range can also be adjusted. By irradiating the cholesteric liquid crystalline phase with patterned ultraviolet light while adjusting the temperature, in a plane of the reflective layer, a plurality of reflecting regions that reflect light components having different wavelength ranges can be provided. In one reflective layer, the reflection center wavelength can be continuously changed by continuously changing the helical pitch. In particular, by irradiating the cholesteric liquid crystalline phase with ultraviolet light in a state where the liquid crystal composition is heated to an isotropic phase temperature or higher, a transmission region having no reflection characteristics in any wavelength range can be formed in a plane.

For example, the reflective layer can be formed of the above-described liquid crystal composition including the chiral agent (photosensitive chiral agent) having the photoisomerization group.

In a case where the reflective layer is prepared, first, a liquid crystal composition including a photosensitive chiral agent that induces twisting corresponding to a desired circular polarization direction, a polymerizable liquid crystal compound, a polymerization initiator, and an alignment agent is prepared.

Next, the prepared liquid crystal composition is applied to a surface of the $\lambda/4$ retardation layer where the reflective layer is formed. The $\lambda/4$ retardation layer has a direction of a slow axis corresponding to the reflective layer to be formed. The application of the liquid crystal composition may be performed using a well-known method such as wire bar coating.

Here, for example, the liquid crystal composition is prepared such that a cholesteric liquid crystal layer that selectively reflects green light, that is, a cholesteric liquid crystal layer having a selective reflection center wavelength in a wavelength range of green light is formed.

In addition, as the photosensitive chiral agent, for example, a chiral agent in which the pitch of the helical structure of the induced cholesteric liquid crystalline phase increases depending on the irradiation dose during the irradiation of ultraviolet light. That is, in a case where this liquid crystal composition is irradiated with ultraviolet light, the selective reflection wavelength of the cholesteric liquid crystal layer to be formed increases (the selective reflection center wavelength increases) depending on the irradiation dose.

Next, the applied liquid crystal composition is irradiated with ultraviolet light through a mask corresponding to the formation region of the reflective layer and including a black light shielding unit that is formed of, for example, black ink.

As described above, the liquid crystal composition forms the cholesteric liquid crystal layer that selectively reflects green light. That is, in a case where the liquid crystal composition (photosensitive chiral agent) is irradiated with ultraviolet light, the selective reflection wavelength of the cholesteric liquid crystal layer to be formed increases depending on the irradiation dose.

Accordingly, by irradiating the liquid crystal composition with ultraviolet light at an irradiation dose such that a cholesteric liquid crystal layer in which the selective reflection wavelength reflects infrared light is formed using the liquid crystal composition, a cholesteric liquid crystal layer that selectively reflects infrared light is formed in a region where the liquid crystal composition is irradiated with ultraviolet light. A cholesteric liquid crystal layer that selectively reflects green light is formed in a region that is shielded with the light shielding unit of the mask.

Next, by heating the liquid crystal composition, the liquid crystal composition enters a state of a cholesteric liquid crystalline phase, and by curing the heated liquid crystal composition, the reflective layer is formed.

Next, by heating the liquid crystal composition, the liquid crystal composition enters a state of a cholesteric liquid crystalline phase, and optionally by irradiating and curing the heated liquid crystal composition with ultraviolet light, the reflective layer is formed. The reflective layer that is formed as described above is formed by irradiating the coating film obtained by uniformly applying the liquid crystal composition with ultraviolet light.

The thickness of the reflective layer is not particularly limited and may be appropriately set depending on the wavelength of visible light that is selectively reflected, the reflectivity of desired visible light, and the like.

In the above-described example, the reflective layer is formed using the liquid crystal composition (photosensitive chiral agent) in which the selective reflection wavelength of the cholesteric liquid crystal layer to be formed increases depending on the irradiation dose during the ultraviolet irradiation. However, the reflective layer may also be formed using a method that is reverse to the method of forming the reflective layer.

In this case, a photosensitive chiral agent in which the pitch of the helical structure that is excited during the irradiation of ultraviolet light decreases is used. A liquid crystal composition including this chiral agent that selectively reflects infrared light is prepared, in which the selective reflection wavelength of the cholesteric liquid crystal layer to be formed decreases depending on the irradiation dose of ultraviolet light. By applying this liquid crystal composition to a surface where the reflective layer is to be formed, the coating film is formed.

In addition, contrary to the above-described example, the liquid crystal composition is irradiated with ultraviolet light after adjusting the amount of transmitted ultraviolet light. As a result, the reflective layer may be formed.

As a non-reflecting region that does not reflect visible light other than the reflective layer, an infrared light reflecting region that selectively reflects infrared light may be provided, but the present invention is not limited thereto.

For example, a reflective layer including an ultraviolet reflecting region that selectively reflects ultraviolet light as the non-reflecting region that does not reflect visible light can also be used.

Alternatively, the non-reflecting region that does not reflect visible light may be a region (region where there is no reflection) that does not reflect not only visible light but also infrared light and ultraviolet light. For example, in the cholesteric liquid crystal layer as the reflective layer, this non-reflecting region can be formed by adjusting the helical pitch of the cholesteric liquid crystalline phase in the non-reflecting region to be more than the thickness of the reflective layer (cholesteric liquid crystal layer).

In the above-described example, the reflective layer that selectively reflects only green light is prepared. For example, however, a reflective layer that selectively reflects red light or blue light can also be prepared using the same method as that of the reflective layer that reflects green light. In addition, one reflective layer can reflect red light, green light, and blue light.

The reflective layer of the optical filter layer 20 can be prepared using the same method as that of the above-described reflective layer, except that the mask pattern is different. In addition, the reflective layer can be formed in a shape other than the triangular shape by changing the shape of the mask pattern.

The reflective layer that can reflect red light, green light, and blue light can be prepared using the same method as that of the above-described reflective layer.

First, as in the above-described reflective layer, for example, a liquid crystal composition for forming the cholesteric liquid crystal layer that selectively reflects blue light is applied to a surface where the reflective layer is to be formed, for example, a surface of the λ/4 retardation layer.

Next, the liquid crystal composition is irradiated with ultraviolet light using a mask having a mask pattern with a concentric circular pattern that is formed of black ink. In this case, the blackness of the concentric circular pattern is adjusted such that the amount of transmitted ultraviolet light continuously changes.

For example, in the circular pattern, by maximizing the amount of transmitted ultraviolet light in the center portion, the amount of transmitted ultraviolet light can be reduced continuously toward the outside.

As described above, the liquid crystal composition forms the cholesteric liquid crystal layer in which the selective reflection wavelength range increases depending on the irradiation dose of ultraviolet light.

Accordingly, the reflection wavelength range can be changed by performing the ultraviolet irradiation after changing the amount of transmitted ultraviolet light through the mask having the concentric circular mask pattern.

Next, as in the above-described reflective layer, the polymerizable liquid crystal compound is aligned to the state of the cholesteric liquid crystalline phase through the heating treatment, and the liquid crystal composition is optionally further irradiated with ultraviolet light to be cured. As a result, for example, as shown in FIG. 12, the reflective layer in which the reflection center wavelength continuously changes can be obtained.

The reflective layer shown in FIG. 12 is circular. However, a reflective layer having a polygonal shape such as a square shape, a rectangular shape, or a hexagonal shape can be used. By two-dimensionally disposing the reflective layers as shown in FIG. 11, gaps between the reflective layers are reduced such that light can be selectively reflected from the entire surface of the optical filter layer 20.

[Patterned Retardation Layer]

The patterned retardation layer gives, for example, λ/4 as a front phase difference. The front phase difference of the patterned retardation layer may be, for example, the length that is ¼ of the visible wavelength range, the center wavelength×n±¼ of the center wavelength (n represents an integer), the reflection wavelength of the reflective layer, or the length that is ¼ of the center wavelength of a luminescence wavelength of a light source.

The patterned retardation layer is not particularly limited and can be appropriately selected depending on the purpose. Examples of the patterned retardation layer include a stretched polycarbonate film, a stretched norbornene polymer film, an aligned transparent film including inorganic particles having birefringence such as strontium carbonate, a thin film obtained by obliquely depositing an inorganic dielectric on a support, and a film obtained by uniaxially aligning the liquid crystal compound and immobilizing the alignment.

As the patterned retardation layer, a film obtained by uniaxially aligning the polymerizable liquid crystal compound and immobilizing the alignment is preferable. For example, the patterned retardation layer can be formed by applying a liquid crystal composition including a polymerizable liquid crystal compound to a temporary support or an alignment layer surface, forming the polymerizable liquid crystal compound in nematic alignment in the liquid crystal composition in a liquid crystal state, and curing the liquid crystal composition to immobilize the alignment state. In this case, the retardation layer can be formed using the same method of forming the above-described cholesteric liquid crystal layer, except that the chiral agent is not added to the liquid crystal composition. During the nematic alignment after the application of the liquid crystal composition, the heating temperature is preferably 50° C. to 120° C. and more preferably 60° C. to 100° C.

The patterned retardation layer may be a layer obtained by applying a composition including a polymer liquid crystal compound to a temporary support or a surface of an alignment layer or the like, forming the polymer liquid crystal compound in nematic alignment in a liquid crystal state, and cooling the composition to immobilize the alignment.

The thickness of the patterned retardation layer is preferably 0.2 to 300 µm, more preferably 0.5 to 150 µm, and still more preferably 1.0 to 80 µm. The thickness of the patterned retardation layer formed of the liquid crystal composition is not particularly limited and is preferably 0.2 to 10 µm, more preferably 0.5 to 5.0 µm, and still more preferably 1.0 to 2.0 µm.

The direction of the slow axis of the phase difference is set. The direction of the slow axis can be set, for example, by rubbing treatment.

A material for forming the patterned retardation layer is not particularly limited to the above-described materials. For example, a liquid crystal compound can be used. More specifically, an optically-anisotropic layer obtained by forming a low-molecular-weight liquid crystalline compound in nematic alignment in a liquid crystal state and immobilizing the alignment by photocrosslinking or thermal crosslinking, or an optically-anisotropic layer obtained by forming a polymer liquid crystal compound in nematic alignment in a liquid crystal state and cooling the composition to immobilize the alignment can be used. It is preferable that the patterned retardation layer is formed of a composition including a discotic liquid crystal compound.

In general, in terms of shape, the liquid crystal compound can be classified into a rod-shaped type (rod-shaped liquid crystal compound) and a discotic type (discotic liquid crystal compound). Further, the liquid crystal compound can also be classified into a low molecular weight type and a high molecular weight type. In general, the high molecular weight type refers to a compound having a polymerization degree of 100 or higher (Polymer Physics-Phase Transition Dynamics, Masao Doi, page 2, Iwanami Shoten Publishers, 1992). In the present invention, any liquid crystal compound can also be used. In addition, two or more rod-shaped liquid crystal compounds, two or more discotic liquid crystal compounds, or a mixture of a rod-shaped liquid crystal compound and a discotic liquid crystal compound may be used.

Further, as the rod-shaped liquid crystal compound, for example, compounds described in claim 1 of JP1999-513019A (JP-H11-513019A) and paragraphs "0026" to "0098" of JP2005-289980A can be preferably used. As the discotic liquid crystal compound, for example, compounds described in paragraphs "0020" to "0067" of JP2007-108732A and paragraphs "0013" to "0108" of JP2010-244038A can be preferably used, but the present invention is not limited thereto.

In order to reduce a temperature change or a humidity change, it is more preferable that the patterned retardation layer is formed of a rod-shaped liquid crystal compound or a discotic liquid crystal compound having a polymerizable group. The liquid crystal compound may also be a mixture of two or more kinds. In this case, it is preferable that at least one liquid crystal compound has two or more polymerizable groups.

That is, it is preferable that the patterned retardation layer is formed by immobilizing a rod-shaped liquid crystal compound or a discotic liquid crystal compound having a polymerizable group by polymerization or the like. In this case, it is not necessary that the layer formed of the liquid crystal compound exhibits liquid crystal properties.

The kind of the polymerizable group in the discotic liquid crystal compound and the rod-shaped liquid crystal compound is not particularly limited, and a functional group capable of an addition polymerization reaction is preferable, and a polymerizable ethylenically unsaturated group or a ring polymerizable group is preferable. More specifically, a (meth)acryloyl group, a vinyl group, a styryl group, or an allyl group is preferable, and a (meth)acryloyl group is more preferable.

Examples of a method of forming the above-described patterned retardation layer include the following preferable aspects. However, the present invention is not limited to these aspects, and a well-known method can be adopted. For example, a method described in JP2014-89431A can be used. In addition, for example, a configuration where a photo-alignment film is used can be suitably used.

The photo-alignment film refers to a film having properties in which anisotropy is exhibited by irradiation of polarized light or unpolarized light such that an alignment restriction force is generated in the liquid crystal. For example, a composition (hereinafter, also referred to as "composition for forming a photo-alignment film") including a polymer or monomer having a photoreactive group and a solvent is applied to a substrate and is irradiated with polarized light (preferably polarized UV (ultraviolet)). As a result, a photo-alignment film to which an alignment restriction force is given can be obtained.

The photoreactive group refers to a group that exhibits a liquid crystal alignment capability during irradiation of light (light irradiation). Specifically, in a case where photoreactive group is irradiated with light, a photoreaction as the origin of the liquid crystal alignment capability, for example, a molecular alignment induction or isomerization reaction, a dimerization reaction, a photocrosslinking reaction, or a photodegradation reaction occurs. Specific examples of the photoreactive group include a group having an azobenzene structure (skeleton), a group having a hydrazono-β-ketoester structure (skeleton), a group having a stilbene structure (skeleton), and a group having a spiropyran structure (skeleton).

In this case in the retardation layer including the photo-alignment film, the direction of the slow axis can be changed by changing the polarization orientation.

[Method of Manufacturing Filter]

Figure 21:
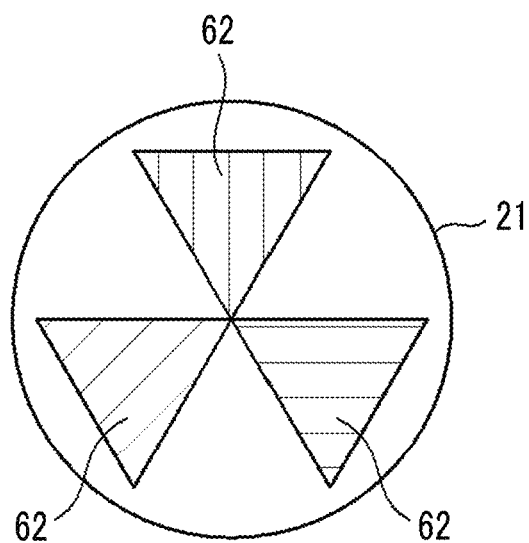
FIG. 21 is a schematic diagram showing one step of the method of manufacturing the filter according to the embodiment of the present invention.
Figure 22:
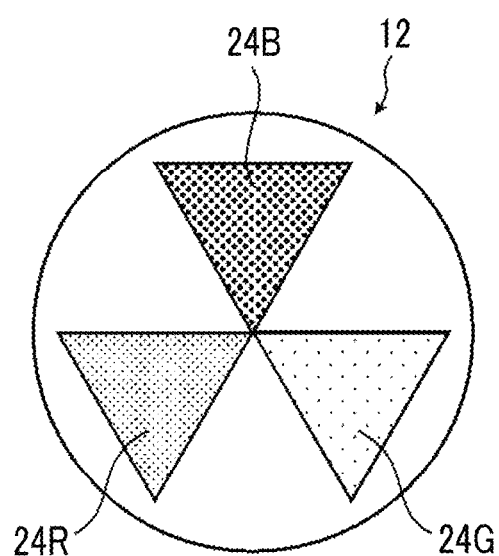
FIG. 22 is a schematic diagram showing one step of the method of manufacturing the filter according to the embodiment of the present invention.
Figure 23:
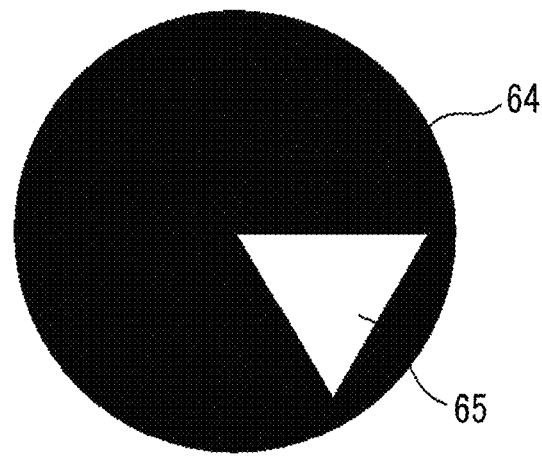
FIG. 23 is a schematic diagram showing a mask used for forming a reflective layer of the filter according to the embodiment of the present invention.
Figure 24:
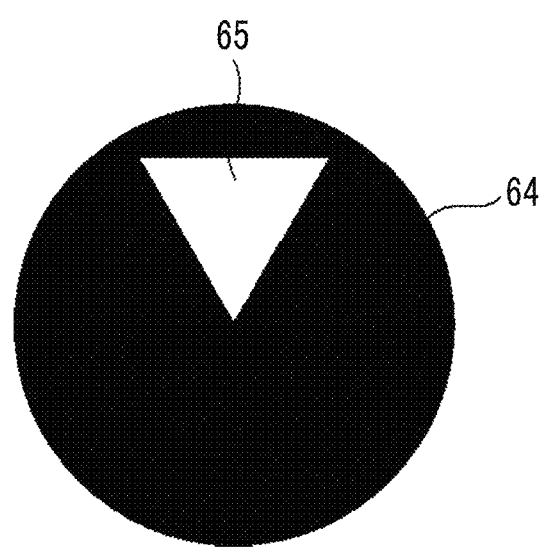
FIG. 24 is a schematic diagram showing the mask used for forming the reflective layer of the filter according to the embodiment of the present invention.
Figure 25:
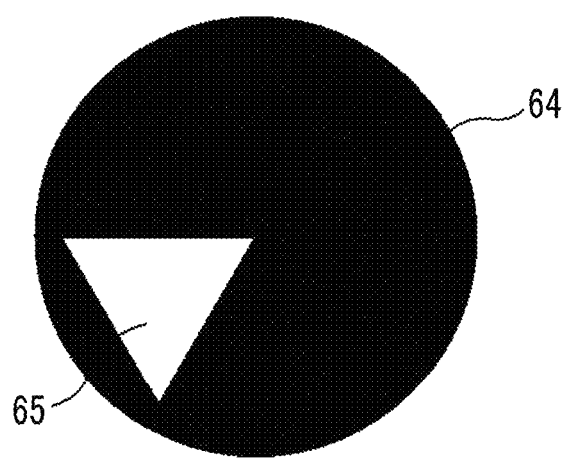
FIG. 25 is a schematic diagram showing the mask used for forming the reflective layer of the filter according to the embodiment of the present invention.

FIGS. 18 to 22 are schematic diagrams showing a method of manufacturing the filter according to the embodiment of the present invention in order of steps. FIGS. 23 to 25 are schematic diagrams showing the mask used for forming the reflective layer of the filter according to the embodiment of the present invention.

In the filter, as described above, the optical filter layer 20 and the patterned retardation layer 22 are laminated.

Figure 18:
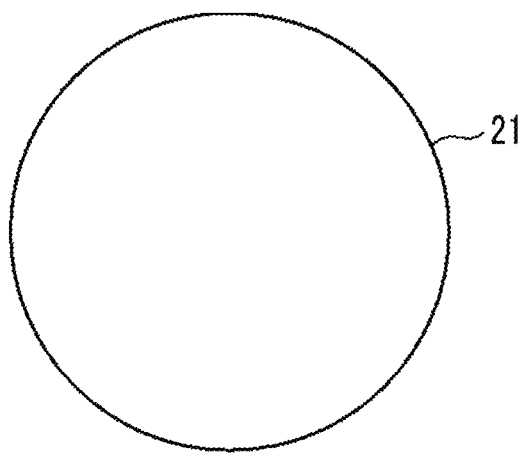
FIG. 18 is a schematic diagram showing one step of a method of manufacturing the filter according to the embodiment of the present invention.

In a case where the filter is manufactured, for example, a glass substrate is prepared as the support substrate 21 as shown in FIG. 18.

Figure 19:
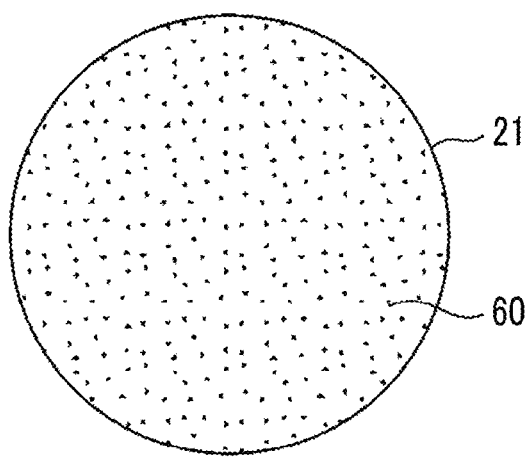
FIG. 19 is a schematic diagram showing one step of the method of manufacturing the filter according to the embodiment of the present invention.

Next, the coating solution for forming a photo-alignment film that forms a photo-alignment film is applied to the entire surface of the support substrate 21 by spin coating and dried. As a result, a coating film 60 is obtained as shown in FIG. 19. The coating film 60 is irradiated with, for example, polarized ultraviolet light corresponding to the direction of the slow axis of the retardation layer.

Figure 20:
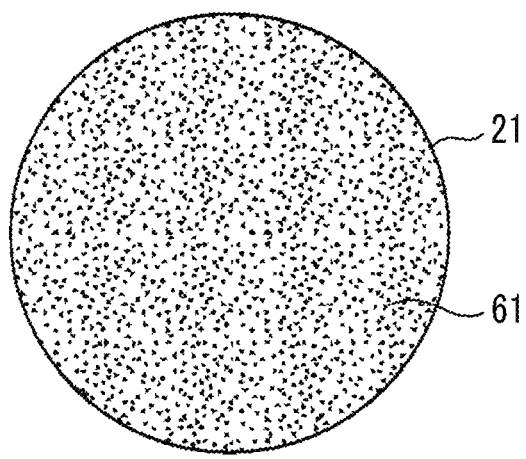
FIG. 20 is a schematic diagram showing one step of the method of manufacturing the filter according to the embodiment of the present invention.

Next, a coating solution for forming a ¼ wave plate is applied to the coating film 60, for example, using a wire bar and dried. As a result, a retardation film 61 is obtained as shown in FIG. 20.

In a case where three reflective layers are provided, in order to change the direction of the slow axis of the retardation layer corresponding to each of the reflective layers, the retardation film 61 is exposed three times after changing the polarization orientation to, for example, 0°, 45°, and 90°. In this case, as shown in FIGS. 23 to 25, the retardation film 61 is irradiated with ultraviolet light while changing the position of an opening portion 65 of a mask 64, or is irradiated with ultraviolet light after preparing three masks 64 having different positions of the opening portions 65.

After the exposure, a coating solution for cholesteric liquid crystal is applied to the retardation film 61 to form a coating film, and this coating film is irradiated with ultraviolet light, for example, in an oxygen atmosphere at room temperature through a mask including an opening portion with a shape of the reflective layer and a black light shielding unit to pattern the coating film in the shape of the reflective layer. As shown in FIG. 21, the patterned coating film 62 is obtained.

Next, the patterned coating film 62 undergoes a heat treatment to enter a state of a cholesteric liquid crystalline phase.

Next, the coating film after the heat treatment is irradiated with ultraviolet light in a nitrogen atmosphere at room temperature to cure the coating film. Thus, a cholesteric liquid crystal layer is formed. As a result, as shown in FIG. 22, the filter 12 including the reflective layers 24R, 24G, and 24B is obtained.

In a case where the reflection center wavelength of the reflective layer continuously changes, as described above, a mask 66 (refer to FIG. 26) including a concentric circular pattern 67 in which the blackness is adjusted such that the amount of transmitted ultraviolet light continuously changes is used. In the mask 66, for example, a region 68 outside the concentric circular pattern 67 may be adjusted such that the irradiation dose is 0 mJ/cm².

Basically, the present invention is configured as described above. Hereinabove, the filter and the imaging apparatus according to the embodiment of the present invention have been described in detail. However, the present invention is not limited to the above-described examples, and various improvements or modifications can be made within a range not departing from the scope of the present invention.

EXAMPLES

Hereinafter, the characteristics of the present invention will be described in detail using examples. Materials, reagents, amounts thereof, proportions thereof, operations, and the like shown in the following examples can be appropriately changed as long as they do not depart from the scope of the present invention. Accordingly, the scope of the present invention is not limited to the following examples.

In the example, a filter according to Examples 1 to 5 and Comparative Example 1 was disposed in the optical system 18 shown in FIG. 1, and an attempt to acquire a multispectral image was made using the polarization image sensor and the processing unit. Whether or not the multispectral image was obtained and a color distribution in an image plane were evaluated.

[Acquisition of Multispectral Image]

The image obtained using the polarization image sensor and the processing unit was evaluated by sensory evaluation based on whether or not the multispectral image was able to be acquired.

[Color Distribution in Image Plane]

Regarding the color distribution in the image plane, an image obtained by disposing the filter at the pupil position of the optical system as shown in FIG. 1 was evaluated by sensory evaluation based on the following evaluation standards. For the subject Oj, a color sample image was used.

Regarding the evaluation standards of the color distribution in the image plane, an image having a uniform tint was evaluated based on five grades E to A. The grades are E, D, C, B, A in order from the highest grades of the color distribution in the image plane.

Hereinafter, the coating solution used for Examples will be described.

<Solution Formula>

(Coating solution A: Photo-Alignment Film)

A 1% aqueous solution of a photo-alignment material E-1 was used.

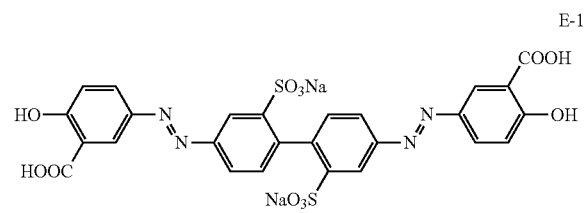

E-1

(Coating Solution B: Coating Solution for Forming ¼ Wave Plate)

The following components were mixed to prepare a coating solution for forming a ¼ wave plate having the following composition.

| | |
|---|---|
| Liquid crystal compound 1 (the following structure): | 80 parts by mass |
| Liquid crystal compound 2 (the following structure): | 20 parts by mass |
| Horizontal alignment agent 2 | 0.1 parts by mass |
| Horizontal alignment agent 1 | 0.007 parts by mass |
| Polymerization initiator IRGACURE-OXE01 (manufactured by BASF SE) | 1.0 part by mass |
| Solvent (methyl ethyl ketone) | an amount in which the solute concentration was 30 mass % |

(Preparation of Coating Solution C: Preparation of Coating Solution for Cholesteric Liquid Crystal)

The following components were mixed with each other to prepare a coating solution C.

| | |
|---|---|
| Liquid crystal compound 1 (the following structure): | 100 parts by mass |
| Chiral agent 1 (the following structure): | 10 parts by mass |
| Horizontal alignment agent 1 (the following structure): | 0.02 parts by mass |
| Horizontal alignment agent 2 (the following structure): | 0.05 parts by mass |
| Photoradical initiator 1 (the following structure): | 4 parts by mass |
| Polymerization inhibitor 1 (the following structure): | 1 part by mass |
| Methyl ethyl ketone (MEK): | 160 parts by mass |

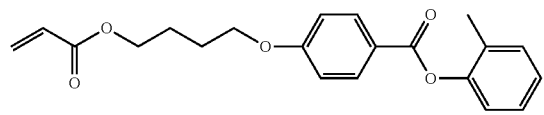 [SMILES: C=CC(=O)OCCCCOc1ccc(C(=O)Oc2ccccc2C)cc1]

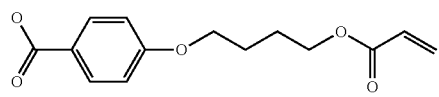 [SMILES: C=CC(=O)OCCCCOc1ccc(C(=O)O)cc1]

Liquid Crystal Compound 1

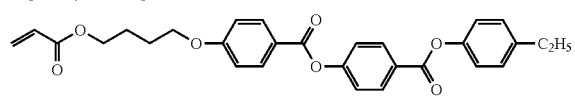

Liquid Crystal Compound 2

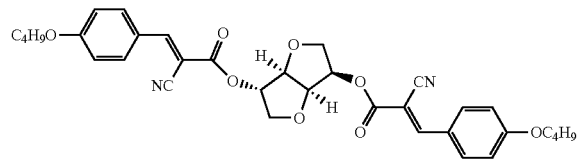

Chiral Agent 1

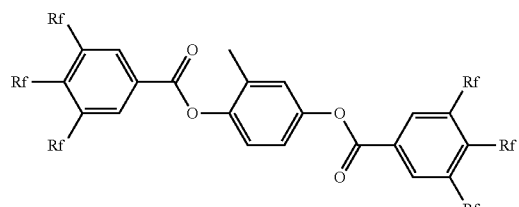

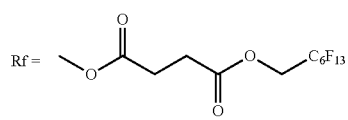

Horizontal Alignment Agent 1

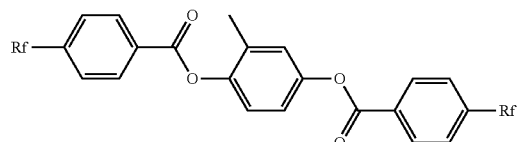

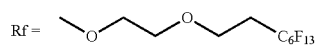

Horizontal Alignment Agent 2

Photoradical Initiator 1 (Manufactured by BASF SE, IRGACURE 907 (the Following Structure))

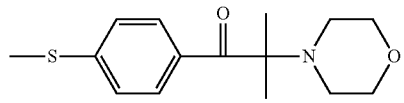 [SMILES: CSc1ccc(C(=O)C(C)(C)N2CCOCC2)cc1]

Polymerization Inhibitor 1 (Manufactured by BASF SE, IRGANOX 1010 (the Following Structure))

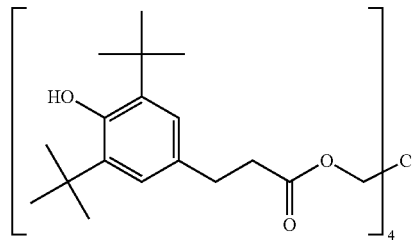

<Process Conditions>

Example 1

(Photo-Alignment Film)

A coating solution for forming a photo-alignment film was applied to a glass plate by spin coating and dried at 100° C. for 1 minute. The obtained coating film was irradiated with ultraviolet light using an air-cooled metal halide lamp (manufactured by Eye Graphics Co., Ltd.) at 160 W/cm$^2$ in air. At this time, a wire grid polarizer (ProFlux PPL02, manufactured by Moxtek, Inc.) was set, and the coating film was exposed three times while changing the polarization orientation to 0°, 45°, and 90° according to a mask for cholesteric liquid crystal. As a result, the same pattern as that of the retardation layer shown in FIG. 3 was exposed.

The distance of the exposure mask surface of the mask for cholesteric liquid crystal and the photo-alignment film was set to 200 μm. The illuminance of the ultraviolet light used at this time was 100 mW/cm$^2$ in the UV-A range (cumulative value at a wavelength of 380 nm to 320 nm), and the irradiation dose was 1000 mJ/cm$^2$ in the UV-A range.

(¼ Wave Plate)

The coating solution for forming a ¼ wave plate was applied to the patterned photo-alignment film using a wire bar. After applying and drying the coating solution, the photo-alignment film was disposed on a hot plate at a temperature of 30° and was irradiated with ultraviolet light for 6 seconds using an electrodeless lamp "D Valve" (60 mW/cm$^2$) (manufactured by Fusion UV Systems K.K.) to immobilize the liquid crystal phase, and a retardation layer having a thickness of about 1.0 μm was obtained. The retardation layer gave a phase difference of ¼ wavelength.

(Cholesteric Liquid Crystal Layer)

The coating solution C was applied to the above-described retardation layer, and the coating film was irradiated with ultraviolet light through a black mask including an opening portion in an oxygen atmosphere at room temperature for a predetermined time.

In the mask, the blackness was set such that a blue reflecting region was irradiated with ultraviolet light at 4 mJ/cm$^2$, a green reflecting region was irradiated with ultraviolet light at 10 mJ/cm$^2$, and a red reflecting region was irradiated with ultraviolet light at 20 mJ/cm$^2$.

Next, the retardation layer on which the above-described coating film was formed was left to stand on a hot plate at 100° C. for 1 minute to perform a heat treatment on the coating film such that the state of the cholesteric liquid crystalline phase was obtained.

Next, after the heat treatment, the coating film was irradiated with ultraviolet light in a nitrogen atmosphere (oxygen concentration: 500 ppm or lower) at room temperature for a predetermined time to cure the coating film. As a result, the cholesteric liquid crystal layer having a thickness of 2 μm was formed. As a result, a reflective layer having the same pattern as that of the reflective layer shown in FIG. 2 was obtained. The cholesteric liquid crystal layer obtained through the above-described steps has a reflecting region having right circularly polarized light reflecting properties.

"EXECURE 3000-W" (manufactured by Hoya Candeo Optronics Corporation) was used as a light source of ultraviolet light in a curing step described below.

In Example 1, the number of reflective layers was 3, the reflection center wavelength of the reflective layer did not continuously change, and a gradation pattern was not able to be obtained. A case where the gradation pattern was not able to be obtained was shown as "None" in "Gradation Pattern" of Table 1 below.

Example 2

Example 2 was the same as Example 1, except that the patterns of the retardation layer and the reflective layer were different. The pattern of the reflective layer according to Example 2 was the same as the pattern of the reflective layer shown in FIG. 8, and the pattern of the retardation layer according to Example 2 was the same as the pattern of the retardation layer shown in FIG. 9. In Example 2, the number of reflective layers was 9, the reflection center wavelength of the reflective layer did not continuously change, and a gradation pattern was not able to be obtained.

Example 3

Example 3 was the same as Example 1, except that the patterns of the retardation layer and the reflective layer were different. The pattern of the reflective layer according to Example 3 was the same as the pattern of the reflective layer shown in FIG. 10. In Example 3, the number of reflective layers was 15, the reflection center wavelength of the reflective layer did not continuously change, and a gradation pattern was not able to be obtained.

Example 4

Example 4 was the same as Example 1, except that Example 1 was changed as follows. The pattern of the reflective layer according to Example 4 was the same as the pattern of the reflective layer shown in FIG. 11. In Example 4, 1000 reflective layers were provided.

While rotating a radius interval of 100 to 200 μm around the polarizing axis on a 15° basis, the photo-alignment film was exposed such that the slow axis of the λ/4 phase difference changed in 0° to 90° depending on the circular gradation pattern of the following cholesteric liquid crystal. Specifically, the photo-alignment film was exposed with a width of 10 μm at each of radius positions of 100 μm, 115 μm, 130 μm, 145 μm, 160 μm, 175 μm, and 190 μm around each of polarizing axes of 0°, 15°, 30°, 45°, 60°, 75°, and 90°.

In addition, a mask having a mask pattern of cholesteric liquid crystal in which the blackness was changed such that the irradiation dose continuously changed in 40 to 0 mJ/cm$^2$ was used.

Figure 26:
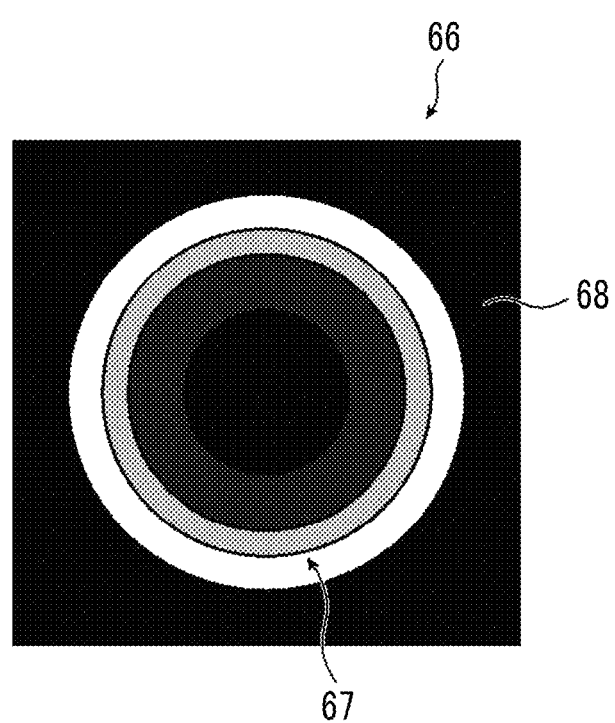
FIG. 26 is a schematic diagram showing a mask used for preparing a filter according to Example 4 of the present invention.

In the above-described mask, mask patterns having irradiation doses of 15 mJ/cm$^2$, 4 mJ/cm$^2$, and 0 mJ/cm$^2$ were concentric circular patterns as shown in FIG. 26, and the diameters of the circles were 175 μm, 130 μm, and 100 μm, respectively. In addition, in the mask, an outside region having a diameter of 200 μm or more was adjusted such that the irradiation dose was 0 mJ/cm$^2$. In Example 4, the number of reflective layers was 1000, the reflection center wavelength of the reflective layer continuously changed, and a gradation pattern was able to be obtained. A case where the gradation pattern was able to be obtained was shown as "Present" in "Gradation Pattern" of Table 1 below.

Example 5

Example 5 was the same as Example 1, except that Example 1 was changed as follows. The pattern of the reflective layer according to Example 5 was the same as the pattern of the reflective layer shown in FIG. 15. The pattern of the patterned retardation layer according to Example 5 was the same as the pattern shown in FIG. 16. In Example 5, 1000 reflective layers were provided.

The photo-alignment film was exposed three times while changing the slow axis of the λ/4 phase difference to 0°, 45°, and 90° depending on the concentric circular pattern of the cholesteric liquid crystal of the reflective layer. As a result, the same pattern as that of the retardation layer shown in FIG. 16 was exposed. Specifically, the photo-alignment film was exposed at each of radius positions of circles of 100 μm, 130 μm, and 175 μm around each of polarizing axes of 0°, 45°, and 90°.

In addition, as the mask of cholesteric liquid crystal, a mask having a concentric circular pattern in which the blackness was changed such that the irradiation doses were 15 mJ/cm$^2$, 4 mJ/cm$^2$, and 0 mJ/cm$^2$ was used. In the mask having the concentric circular pattern, as in the exposure pattern to the photo-alignment film, the diameters of the circles were 175 μm, 130 μm, and 100 μm, respectively. In addition, in the mask having the concentric circular pattern, an outside region having a diameter of 200 μm or more was adjusted such that the irradiation dose was 0 mJ/cm$^2$. In Example 5, the number of reflective layers was 1000, the reflection center wavelength of the reflective layer did not continuously change, and a gradation pattern was not able to be obtained.

Comparative Example 1

Comparative Example 1 was the same as Example 1, except that the direction of the slow axis of the retardation layer was only 0°. In Comparative Example 1, the direction of the slow axis of the retardation layer did not correspond to the reflection center wavelength of the reflective layer. In addition, in Comparative Example 1, a gradation pattern was not able to be obtained.

the gradation pattern was provided, that is, the reflection center wavelength of the reflective layer continuously changed, the color distribution in the image plane was further improved.

EXPLANATION OF REFERENCES 10, 10a: imaging apparatus
12: filter
14: polarization image sensor
16: processing unit
18: optical system
20: optical filter layer
21, 23: support substrate
22: patterned retardation layer
24, 24B, 24G, 24R: reflective layer
25, 27, 68: region
26: retardation layer
26a, 26b, 26c: retardation layer
28: compartment
29: slow axis
30: first lens group
30a, 30b, 30c: lens
32: second lens group
32a, 32b, 32c, 32d: lens
34: second lens group
40: pixel array layer
41: photodiode
42: polarization filter element array layer
43: polarization filter element
44: microlens array layer
45: microlens
50: signal processing unit

TABLE 1

|  |  | Example 1 | Example 2 | Example 3 | Example 4 | Example 5 | Comparative Example 1 |
|---|---|---|---|---|---|---|---|
| Configuration | Number of Reflective Layers | 3 | 9 | 15 | 1000 | 1000 | 3 |
|  | Gradation Pattern | None | None | None | Present | None | None |
|  | Correspondence to Retardation Layer | Present | Present | Present | Present | Present | None |
| Evaluation | Acquisition of Multispectral Image | Able | Able | Able | Able | Able | Not Able |
|  | Color Distribution in Image Plane | B | C | D | E | D | A |

As shown in Table 1, in Examples 1 to 5, a multispectral image was able to be obtained, and the color distribution in the image plane was excellent.

In Comparative Example 1, the configuration of the reflective layer was the same as that of Example 1, but the directions of the slow axes of the retardation layers were different from each other. Therefore, a multispectral image was not able to be obtained, and the color distribution in the image plane was poor.

In Examples 1 to 3 where the configurations of the reflective layers were the same and a gradation pattern was not provided, as the number of the reflective layers increased, the result of the distribution in the image plane was further improved.

In addition, it was found from a comparison between Examples 1 to 3 and 5 and Example 4 that, in a case where 52: image generation unit
54: storage unit
60; coating film
61: retardation film
62: coating film
64, 66: mask
65: opening portion
67: concentric circular pattern
Aa, Ab, Ac: slow axis
D: direction
L: optical axis
Oj: subject
Pb: pixel block
Pi: pixel
αb, αc: angle

What is claimed is:

1. A filter comprising:
an optical filter layer; and
a patterned retardation layer that is laminated on the optical filter layer,
the optical filter layer includes a reflective layer that is formed of a cholesteric liquid crystal layer having at least two different reflection center wavelengths, and
the patterned retardation layer has a slow axis in a direction corresponding to the reflection center wavelength of the reflective layer,
wherein a helical pitch of the cholesteric liquid crystal layer continuously changes such that the reflection center wavelength continuously changes.

2. The filter according to claim 1,
wherein the optical filter layer includes at least one compartment, and
the reflective layer is provided in the compartment.

3. An imaging apparatus comprising:
the filter according to claim 1;
an imaging element that focuses light passing through the filter; and
a polarization image sensor to which the light focused by the imaging element is input.

4. A filter comprising:
an optical filter layer; and
a patterned retardation layer that is laminated on the optical filter layer,
wherein the optical filter layer includes at least three reflective layers that are formed of a cholesteric liquid crystal layer,
the reflective layers have different reflection center wavelengths, and
the patterned retardation layer has a slow axis in a direction corresponding to the reflection center wavelength of the reflective layer,
wherein the optical filter layer includes at least three compartments, and
a plurality of reflective layers in which the reflection center wavelengths are different are provided in each of the compartments.

5. The filter according to claim 4,
wherein the compartment of the optical filter layer has a triangular shape, and
the compartments having the triangular shape are disposed such that apexes thereof meet each other.

6. The filter according to claim 4,
wherein the compartment of the optical filter layer has a circular shape.

7. The filter according to claim 4,
wherein the compartment of the optical filter layer has a circular shape, and
a plurality of reflective layers in which the reflection center wavelengths are different are provided in a radial shape starting from a center of the compartment having the circular shape.

8. An imaging apparatus comprising:
a filter comprising:
an optical filter layer; and
a patterned retardation layer that is laminated on the optical filter layer,
wherein the optical filter layer includes at least three reflective layers that are formed of a cholesteric liquid crystal layer,
the reflective layers have different reflection center wavelengths, and
the patterned retardation layer has a slow axis in a direction corresponding to the reflection center wavelength of the reflective layer,
an imaging element that focuses light passing through the filter; and
a polarization image sensor to which the light focused by the imaging element is input.

9. An imaging apparatus comprising:
a filter comprising:
an optical filter layer; and
a patterned retardation layer that is laminated on the optical filter layer,
the optical filter layer includes a reflective layer that is formed of a cholesteric liquid crystal layer having at least two different reflection center wavelengths, and
the patterned retardation layer has a slow axis in a direction corresponding to the reflection center wavelength of the reflective layer,
an imaging element that focuses light passing through the filter; and
a polarization image sensor to which the light focused by the imaging element is input.

* * * * *